US009562812B2

(12) United States Patent
Yoshimura

(10) Patent No.: US 9,562,812 B2
(45) Date of Patent: Feb. 7, 2017

(54) TEMPERATURE MEASURING DEVICE OF A POWER SEMICONDUCTOR APPARATUS

(75) Inventor: Hiroyuki Yoshimura, Yokohama (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 759 days.

(21) Appl. No.: 13/607,017

(22) Filed: Sep. 7, 2012

(65) Prior Publication Data
US 2013/0060499 A1  Mar. 7, 2013

(30) Foreign Application Priority Data

Sep. 7, 2011 (JP) ................................ 2011-194942

(51) Int. Cl.
| | | |
|---|---|---|
| *G01K 15/00* | (2006.01) | |
| *G01K 3/14* | (2006.01) | |
| *G01K 7/01* | (2006.01) | |
| *H03K 17/08* | (2006.01) | |

(52) U.S. Cl.
CPC . *G01K 3/14* (2013.01); *G01K 7/01* (2013.01); *G01K 15/005* (2013.01); *G01K 2219/00* (2013.01); *H03K 2017/0806* (2013.01)

(58) Field of Classification Search
CPC .......... G01K 3/14; G01K 7/01; G01K 15/005; G01K 2219/00; H03K 2017/0806
USPC ........................................................ 702/99
See application file for complete search history.

(56) References Cited

U.S. PATENT DOCUMENTS

| 5,918,982 A * | 7/1999 | Nagata ..................... G01K 7/01 |
| | | 374/178 |
| 7,031,822 B1* | 4/2006 | Hashimoto et al. .......... 701/103 |
| 2003/0001630 A1 | 1/2003 | Sakata et al. |
| 2006/0153277 A1* | 7/2006 | Yoshida ................. G01K 3/005 |
| | | 374/178 |

(Continued)

FOREIGN PATENT DOCUMENTS

| JP | H07-055588 A | 3/1995 |
| JP | 2004-117111 A | 4/2004 |

(Continued)

OTHER PUBLICATIONS

Japanese Office Action dated Apr. 28, 2015.

*Primary Examiner* — John Breene
*Assistant Examiner* — Stephanie Bloss
(74) *Attorney, Agent, or Firm* — Rabin & Berdo, P.C.

(57) ABSTRACT

A temperature measuring device of a power semiconductor apparatus that accurately detects chip temperature even where a gradient of the measured characteristic line segment is different from a designed gradient, including a chip temperature detecting circuit that includes an A/D converter delivering a measurement value of a digital converted forward voltage across a temperature detecting diode and an operational processing unit for calibration and chip temperature calculation. In calibration processing, different known reference voltages are applied by a reference connected in place of the diode and a gradient of the line segment connecting the measurement values is calculated. The gradient is stored in a memory with an offset correction value that is one of the measurement values. A chip temperature is calculated based on a forward voltage across the diode calculated based on the measurement value and the stored values of the gradient and the offset correction value.

7 Claims, 21 Drawing Sheets

(56) References Cited

U.S. PATENT DOCUMENTS

| 2007/0097718 | A1* | 5/2007 | Nahar et al. | 363/65 |
| 2008/0238383 | A1* | 10/2008 | Watanabe et al. | 323/271 |
| 2009/0051307 | A1* | 2/2009 | Katsuyama et al. | 318/472 |
| 2011/0148202 | A1* | 6/2011 | Rada et al. | 307/52 |

FOREIGN PATENT DOCUMENTS

| JP | 2005-333667 A | 12/2005 |
| JP | 2006-207387 A | 8/2006 |
| JP | 2008-116233 A | 5/2008 |
| JP | 2008-197011 A | 8/2008 |
| JP | 4229945 B2 | 2/2009 |

* cited by examiner

TEMPERATURE MEASURING DEVICE OF A POWER SEMICONDUCTOR APPARATUS

CROSS-REFERENCE TO RELATED APPLICATION

This application is based on, and claims priority from Japanese Patent Application No. 2011-194942, filed on Sep. 7, 2011, the contents of which are incorporated herein by reference.

BACKGROUND OF THE INVENTION

1. Field of the Invention

The present invention relates to a temperature measuring device for a semiconductor apparatus installed in voltage converters for electronic systems of vehicles or the like.

2. Description of the Related Art

In recent onboard apparatus, a vehicle driving system 1100, as shown in FIG. 11, having an electric motor 1104 to generate driving force, may include the main sections of a power supply 1101, a buck-boost converter 1102, and an inverter 1103, to achieve high efficiency and energy saving. The three phase motor 1104 is a motor when it drives a vehicle, but becomes a generator when it brakes the vehicle. The arrow Y1 indicates the direction of energy flow when the vehicle is driven and the arrow Y2 indicates the direction of energy flow when the vehicle is braked.

The voltage $V_L$ of power supply 1101 is obtained from overhead wires or from series-connected batteries.

When the vehicle is driven, the buck-boost converter 1102 steps-up the voltage $V_L$ (280 V, for example) from the power supply 1101 to a voltage $V_H$ (750 V, for example) suited for driving the motor 1104; and when the vehicle is braked, the buck-boost converter 1102 steps-down the voltage $V_H$ (750 V, for example) that is generated by the motor 1104 to the voltage $V_L$ (280 V, for example) of the power supply circuit, performing regenerative braking.

When the vehicle is driven, the inverter 1103 supplies current to the phases of the three phase motor 1104 from the voltage $V_H$ that has been stepped-up by the buck-boost converter 1102 by ON-OFF controlling the switching elements in the inverter 1103. The speed of the vehicle is varied by the frequency of the ON-OFF switching. When the vehicle is braked, the inverter 1103 performs a rectification operation by ON-OFF controlling the switching elements in synchronism with the voltage generated in each phase of the motor 1104, and the inverter 1103 converts the voltage in the phases of the motor 1104 to a DC voltage by the rectification operation, resulting in regenerative braking.

Next, a detailed construction of the buck-boost converter 1102 is described with reference to FIG. 12. The buck-boost converter 1102 comprises main components of: a reactor R, a capacitor C, two switching elements SW1 and SW2, and two control circuits 1111 and 1112 for controlling the switching elements SW1 and SW2. Switching elements SW1 and SW2 in recent driving systems of onboard apparatus may each be composed of an IGBT 1105 (or 1106) and a diode D1 (or D2) connected in parallel with the IGBT 1105 (or 1106) between emitter and collector thereof as shown in FIG. 12. With this connection, the current in the diode D1 (or D2) flows in the reverse direction to the current in the IGBT 1105 (or 1106).

The following describes the principle of step-up and step-down operation of the buck-boost converter 1102. FIG. 13 shows the waveforms of the current flowing in the reactor R in the step-up operation.

The step-up operation is first described. When the IGBT 1105 of the switching element SW1 is in the ON state (conducting state) during the time periods from t0 to t1, from t2 to t3, and from t4 to t5 indicated in FIG. 13, electric current I flows in the reactor R and energy $LI^2/2$ is stored in the reactor R having an inductance L.

In the OFF state (non-conducting state) of the IGBT 1105 of the switching element SW1 during the periods from t1 to t2, from t3 to t4, and after t5, electric current I flows through the diode D2 of the switching element SW2 and the energy stored in the reactor R is transferred to the capacitor C.

Next, step-down operation is described. In the ON state (conducting state) of the IGBT 1106 of the switching element SW2, current I flows through the reactor R and energy $LI^2/2$ is stored in the reactor R.

In the OFF state (non-conducting state) of the IGBT 1106 of the switching element SW2, current flows through the diode D1 of the switching element SW1 and the energy stored in the reactor R is regenerated to the power supply 1101.

Thus, stepped-up and stepped-down voltages can be adjusted by varying ON time (ON duty factor) of the switching element SW1 and SW2. The following relation approximately holds.

$$V_L/V_H = \text{ON duty factor (\%)},$$

where
 $V_L$ is the power supply voltage,
 $V_H$ is the voltage after the stepping-up operation; and
 the ON duty factor is a fraction of a conducting period in the switching period of the switching element SW1 or SW2.

In actual operation, however, to cope with variations in the load and power supply voltage, the stepped-up voltage $V_H$ is monitored and the ON time (or ON duty factor) of the switching element SW1 or SW2 is controlled to attain the target value of the voltage.

FIG. 14 is a block diagram of an intelligent power module (IPM) 2100 for a buck-boost converter. The main sections of IPM 2100 are a lower arm switching section 2101, an upper arm switching section 2102, and a control section 2103. The switching sections 2101 and 2102 are high voltage circuits that must be electrically isolated from the control section 2103, which is a low voltage circuit. Thus, signals are transmitted between the high and low voltage circuits through photo-couplers 2115, 2116, 2117, 2118, and 2119, pulse transformers (not depicted), or like circuit components.

The upper arm switching section 2102 comprises a temperature detecting diode 2142 that is embedded in a switching element chip SW12 together with IGBT 2112 and diode D12, an IGBT protecting circuit 2122 connected to the anode of the temperature detecting diode 2142 and to the point between series-connected resistances R1421 and R1422 that are provided between the emitter of the IGBT 2112 and ground, a gate driver 2124 connected to the output terminal of the IGBT protecting circuit 2122 and to a gate terminal of the IGBT 2112, and an IGBT chip temperature detecting unit 2126 connected to the anode of the temperature detecting diode 2142.

The lower arm switching section 2101 comprises a temperature detecting diode 2141 that is embedded in a switching element chip SW11 together with IGBT 2111 and diode D11, an IGBT protecting circuit 2121 connected to the anode of the temperature detecting diode 2141 and to the point between series-connected resistances R1411 and R1412 that are provided between the emitter of the IGBT 2111 and ground, a gate driver 2123 connected to the output terminal of the IGBT protecting circuit 2121 and to the gate terminal of the IGBT 2111, and an IGBT chip temperature detecting unit 2125 connected to the anode of the temperature detecting diode 2141, and a $V_H$ detecting circuit 2150 for detecting a stepped-up voltage $V_H$.

The $V_H$ detecting circuit 2150 comprises a voltage dividing circuit 2151 for dividing the input voltage $V_H$, a level adjusting circuit 2152 for adjusting a level of the voltage divided by the voltage dividing circuit 2151, a triangular wave generator 2153 for generating a triangular wave, and a comparator 2154 for comparing the triangular wave and the level adjusted voltage and delivering an "L" or "H" level voltage obtained by the comparison to a photo-coupler 2119.

The control section 2103 comprises a low pass filter (LPF) 2161 for smoothing a signal "0" corresponding to the "L" and the signal "1" corresponding to the "H" from the photo-coupler 2119 and converting them to DC level signals, a $V_H$ comparator 2162 for comparing the DC level signal from the LPF 2161 with a buck-boost instruction value, and a gate signal generator 2163 for delivering gate signals to the photo-couplers 2115 and 2117 so that the stepped-up voltage $V_H$ attains a predetermined voltage corresponding to the buck-boost instruction value in response to the comparison results from the $V_H$ comparator 2162.

In the IPM 2100 having the construction described above, the present invention relates in particular to the IGBT chip temperature detecting units 2125 and 2126 for detecting the chip temperature of the IGBTs 2111 and 2112 based on the VF voltages across the temperature detecting diodes 2141 and 2142 embedded in the switching element chips SW11 and SW12 in order to control operation of the IPM 2100 as a power system.

The IGBT chip temperature detecting unit 2126 in the upper arm switching section 2102 is selected as representative of the IGBT chip temperature detecting units 2125 and 2126 and described in detail in the following with reference to FIG. 15 which is a block diagram of the IGBT chip temperature detecting unit 2126, on the understanding that the operation of the IGBT chip temperature detecting unit 2125 is substantially the same.

The IGBT chip temperature detecting unit 2126 comprises, on the high voltage circuit side thereof, a constant current source 2170 connected to the anode of the temperature detecting diode 2142, a buffer circuit 2171 that is an operational amplifier having a + input terminal connected to the point between the constant current source 2170 and the temperature detecting diode 2142, a level converter 2177, a triangular wave generator 2178, a comparator 2179 that is an operational amplifier connected to the output terminal of the triangular wave generator 2178 and the output terminal of the level converter 2177, where the output terminal of the comparator 2179 is connected to a gate terminal of field effect transistor 2181 in a PWM-analogue converter 2190 through a resistance 2180 and the drain terminal of the field effect transistor 2181 is connected to a photo-coupler 2116 of the PWM-analogue converter 2190 through a resistance 2182.

The level converter 2177 comprises an operational amplifier 2173 with the − input terminal thereof connected to the output terminal of the buffer circuit 2171 through a resistance 2172, a resistance 2174 connected between the − input terminal and the output terminal of the operational amplifier 2173, and resistances 2175 and 2176 connected between a first power supply Vcc1 and the ground with the connection point between the two resistances connected to the + input terminal of the operational amplifier 2173.

The PWM-analogue converter 2190 further comprises the photo-coupler 2116, a binarization circuit 2191, a buffer circuit 2192, and an LPF circuit 2193.

The photo-coupler 2116 is connected between the first power supply Vcc1 and the FET 2181 and comprises a light emitting diode 2185 with a resistance 2184 connected in parallel thereto and a photo detecting diode 2187 that receives the light emitted by the light emitting diode 2185. The photo detecting diode 2187 is connected between the base terminal of a transistor 2188 and a second power supply Vcc2. A resistance 2189 is connected between the cathode of the photo detecting diode 2187 and the collector terminal of the transistor 2188.

The emitter terminal of the transistor 2188 of the photo-coupler 2116 is connected to the binarization circuit 2191, the output terminal of which is connected to the + input terminal of the buffer circuit 2192, an operational amplifier. The − input terminal of the buffer circuit 2192 is connected to the output terminal of the buffer circuit 2192, which is connected to the low pass filter (LPF) circuit 2193.

In operation of the IGBT chip temperature detecting unit 2126 to measure the temperature of the IGBT 2112, a constant current is fed from the constant current source 2170 to the temperature detecting diode 2142 embedded in the same chip as the IGBT 2112. The voltage VF across the temperature detecting diode 2142 (the voltage is also referred to as a "VF voltage signal") exhibits a linear dependence on temperature as shown in FIG. 16. As shown in FIG. 16, the voltages VF are VF=1.5 V at T=165° C. and VF=2.0 V at T=25° C., where T is the chip temperature of the temperature detecting diode 2142. Thus, the full span for the actual temperature signal is a variation of the VF of 500 mV.

FIG. 17 shows a detailed construction of a VF/PWM conversion circuit having the buffer circuit 2171, the level conversion circuit 2177, the triangular wave generating circuit 2178, and the comparator 2179.

The triangular wave generator 2178 comprises a comparator 2201, an operational amplifier 2202; and resistances R21, R22, R23, R24, R25, R26, and a capacitor C11, which are connected as indicated in FIG. 17 to the − and + input terminals and the output terminals of the comparator 2201 and the operational amplifier 2202 or to the power supply Vcc1 or the ground.

The triangular wave generator 2178 delivers triangular wave signals with a predetermined range between an upper limit and a lower limit.

The forward voltage drop VF across the temperature detecting diode 2142 undergoes impedance conversion in the buffer circuit 2171, and is then amplified and subjected to addition and subtraction operation in the level converter 2177 so that the upper limit value of the triangular wave signal corresponds to the VF in the side of high temperature (165° C., for example), and the lower limit value of the triangular wave signal corresponds to the VF in the side of low temperature (25° C., for example).

The level converter 2177 performs gain adjustment and offset adjustment. The gain adjustment expands the width of the VF voltage signal so that the level of the width of the VF voltage signal matches the level of the width (amplitude) between the upper limit and the lower limit of the triangular wave signal. The offset adjustment makes the top and bottom levels of the expanded VF voltage signal in coincidence with the positions of the upper limit and the lower limit of the triangular wave. Specific gain and offset adjustment are carried out as follows.

As shown in FIG. 17, the voltage of the power supply Vcc1 is divided by the resistances R11 and R12 and given to the + input terminal of the operational amplifier 2173, and the amount of offset is determined by the resistance R13 connected between the power supply Vcc1 and the − input terminal of the operational amplifier 2173. The gain of the operational amplifier 2173 is determined by the resistance R14 connected between the output terminal of the buffer circuit 2171 and the − input terminal of the operational amplifier 2173 and the resistance R15 connected between the − input terminal and the output terminal of the operational amplifier 2173.

After this level adjustment, a comparator 2179 in the next stage compares the output voltage Vlev of the level converter 2177 and the output voltage Vtri of the triangular wave generator 2178. If Vlev>Vtri, then the output of the comparator 2179 is "L"; if Vlev<Vtri, then the output is "H".

The duty factor of the output pulses of the comparator 2179 thus generated is proportional to the VF voltage signal. For example, a duty factor of zero % corresponds to a low temperature (25° C.) side VF and a duty factor of 100% corresponds to a high temperature (165° C.) side VF. The PWM signal bearing the VF voltage signal is transmitted, through the isolated transmission circuit of the photo-coupler 2116 or 2118, from the upper arm switching section 2101 or the lower arm switching section 2102 to the binarization circuit 2191 in the control section 2103.

From the PWM signal, the binarization circuit 2191 generates and outputs a voltage, a binarized signal V1/V2, which is V1 for zero % of the duty factor of the PWM signal and V2 for 100% of the duty factor. The binarized signal V1/V2 receives impedance conversion in the buffer circuit 2192 and then smoothed in the LPF circuit 2193 to be converted into a DC level signal.

Thus, an IGBT chip temperature voltage signal Vout, which is an output voltage isolated from each arm, is obtained.

Thus-obtained voltage signal Vout proportional to the IGBT chip temperature is transmitted to a system at a higher level (not depicted in the drawings) in the buck-boost converter 1102. Monitoring the temperatures of the IGBTs 2111 and 2112 continuously, the higher level system works, for example to reduce the switching frequency to a half when the IGBT chip temperature exceeds a first predetermined temperature T1 and to stop switching operation (or buck-boost operation) in order to perform a protecting function when the IGBT chip temperature exceeds a second predetermined temperature T2.

Execution of the protecting function affects driving the vehicle, so the chip temperature of the IGBTs 2111 and 2112 must be measured accurately - - - with an accuracy in the range of about ±5%. Error factors in chip temperature measurement can be the scattering of characteristics of two categories of components; the scattering of the forward voltage drop VF and the temperature coefficient thereof of the temperature detecting diodes 2141 and 2142 embedded in the IGBT chip, and the scattering of the characteristics of the circuits including the buffer circuit 2171, the level converter 2177, the triangular wave generator 2178, the photo-coupler 2116 (which is an isolated transmission circuit for PWM signals), the binarization circuit 2191, the buffer circuit 2192, and the LPF circuit 2193.

The scattering of the VF values of the temperature detecting diodes 2141 and 2142 is primarily caused by semiconductor processing. If the scattering of the VF values is estimated to be ±3%, which is about 60% of the overall allowed error of ±5%, the error permitted for the other circuit components is ±2%. This requires each of the other circuit components to be within an error suppressed to about ±0.5%.

Accordingly, high accuracy products must be used for circuit components including resistance elements, constant voltage elements, and operational amplifiers. In consideration of guaranteeing operation over a wide temperature range of −40° C. to +105° C. for the onboard environment, high reliability required by onboard applications, and quick response to customer complaints, selection of those circuit components should be made from ICs for onboard applications supplied by major manufacturers of semiconductor products.

As shown in FIG. 15, the forward voltage drop VF across the temperature detecting diode 2142 developing with the constant current IF supplied by the constant current source 2170 is given to the + terminal of the buffer circuit 2171 and receives impedance conversion there, and is delivered to the level converter 2177. The forward voltage drop VF corresponds to the temperature of the temperature detecting diode 2142 and may have values of, for example, VF=1.5 V for a chip temperature of 165° C. and VF=2.0 V for 25° C.

As shown in FIG. 17, the + input terminal of the operational amplifier 2173 of the level converter 2177 is fixed to an electric potential of Vcc11 that is a divided voltage of the potential of the power supply Vcc1 divided by the resistances R11 and R12. The output voltage Vlev of the operational amplifier 2173 is given by the equation (1) below.

$$V_{lev} = V_{cc11} - R_{15}\left(\frac{V_{cc1} - V_{cc11}}{R_{13}} + \frac{V_F - V_{cc11}}{R_{14}}\right) \quad (1)$$

The upper limit value Vsu and the lower limit value Vsd of the triangular wave signal from the triangular signal generator 2178 are given by the equations (2) and (3) below. Here, the − input terminal of the comparator 2201 is fixed to an electric potential of Vcc12 that is a divided voltage of the potential of the power supply Vcc1 divided by the resistances R21 and R22.

$$V_{su} = V_{cc12} + R_{26}\left(\frac{V_{cc12} - V_{ic3LOW}}{R_{25}}\right) \quad (2)$$

$$V_{sd} = V_{cc12} - R_{26}\left(\frac{V_{cc1} - V_{cc12}}{R_{23} + R_{24} // R_{25}}\right) \times \frac{R_{24}}{R_{24} + R_{25}} \quad (3)$$

The $Vic3_{LOW}$ in equation (2) represents the "L" level output voltage of the comparator 2201. The symbol "//" in equation (3) is a simplified representation of a combined resistance of the parallel connected resistances indicated at the both sides of the symbol "//". The representation "R24//R25", for example, indicates a combined resistance of the resistances R24 and R25 that are connected in parallel.

The comparator 2179 compares the output signal of triangular wave having the upper limit value Vsu and the lower limit value Vsd from the triangular wave generator 2178 with the output signal of the level converter 2177. The comparator 2179 generates a PWM signal with a pulse width corresponding to the chip temperature as given by equations (4), (5), and (6) below.

Condition 1: $Vsu \geq Vlev$

Duty=100% (4)

Condition 2: $Vsu \geq Vlev \geq Vsd$

Duty=(Vlev−Vsd)/(Vsu−Vsd) (%)  (5)

Condition 3: $Vsd \geq Vlev$

Duty=0%  (6)

The PWM signal is transmitted successively, as shown in detail in FIG. 18, through the photo-coupler 2116 in the PWM-analogue converter 2190, to the binarization circuit 2191, comprising transistor 2250 and resistors R30, R31, R32 and R628, the buffer circuit 2192, comprising operational amplifier IC601 in section 2190a, and the LPF circuit 2193, which comprises resistor R637 and capacitor C604. The relation between the duty factor Duty of the PWM signal and the output $V_{LPF}$ of the LPF circuit 2193, which is the IGBT chip temperature voltage signal Vout, is given by the equation (7) below.

$$V_{LPF} = \frac{R_{32} \times V_{cc2}}{R_{31} + R_{32}} Duty + \left\{ V_{cc2} - \frac{V_{cc2} - \frac{R_{32} V_{ce}}{R_{30} + R_{32}}}{R_{32} + R_{31} - \frac{R_{32}}{R_{30} + R_{32}}} R_{31} \right\} \times (1 - Duty) \quad (7)$$

In the equation (7), Vice is a collector-emitter voltage of the transistor 2250 in a saturated condition, and is about 0.15 V. As can be seen from the equations (1), (2), (3), and (7), the error in the output of the LPF circuit 2193 depends on the scattering of the voltages of the power supplies Vcc1 and Vcc2 when resistance elements with high accuracy of ±0.1% are used.

The power supply Vcc1, in particular, which is used in a circuit managing a signal with a full span of 500 mV, is necessarily a voltage source with high stability and high accuracy. Accordingly, a shunt regulator with high accuracy should be used. The power supply Vcc2, on the other hand, which manages a signal with a full span of 4 V, does not need such accuracy as the one required for the power supply Vcc1.

FIG. 19 shows the distribution of the electric potential of the power supply Vcc1 that is supplied from a shunt regulator; and FIG. 20 shows the distribution of the electric potential of the power supply Vcc2 that is supplied from a high accuracy voltage regulator.

The scattering of the voltages of the reference voltage sources, i.e. the variation of the voltages Vcc1 and Vcc2, affects the span and the offset of the output voltage $V_{LPF}$ of the LPF circuit corresponding to the chip temperature, as can be seen from the equations (1), (2), (3), and (7). The span is basically assigned to be 130° C. for the temperature and 4 V for the output voltage; and the offset is assigned to be 4.5 V at a temperature of 25° C.

FIGS. 21 and 22 show the effects of the variation of the voltage of Vcc1 on the output of the LPF circuit 2193. FIGS. 23 and 24 show the effects of the variation of the voltage of Vcc2 on the output of the LPF circuit 2193.

A normal distribution is assumed for the distribution of output voltage of Vcc1 and Vcc2, and statistical calculations have been made for errors and accumulated distribution rate in the interval in the IGBT chip temperature voltage signal Vout (which is the LPF output) in the range up to 3σ from the center of the distribution. The calculation result has revealed that the error in temperature measurement of the circuit is suppressed to within ±2.88% in the range of 1.2σ including 77% of population, but the error exceeds ±2.88% in the remaining 23% of population. Accordingly, the resistance value of the resistance R13 in the level converter 2177 in FIG. 17 needs to be changed for offset adjustment and the resistance value of the resistance R15 needs to be changed for gain adjustment.

For the resistances R13 and R15, resistance elements with low resistance values are preliminarily packaged in order to allow later adjustment within ±5σ. The target resistance value may be achieved by partially cutting the resistance pattern of the low resistance elements with a laser trimming device.

In this resistance adjustment procedure, two known voltages VF1 and VF2 are given as input signals to the chip temperature measuring circuit and two output voltage Vout1_m and Vout2_m are measured to determine the respective differences from the target voltage values Vout1_s and Vout2_s. Based on the differences obtained, the target resistance values of the resistances R13 and R15 are determined and the trimming is carried out on R13 and R15.

After that, two known voltages VF1 and VF2 are again given to the chip temperature measuring circuit after the trimming process and the output voltages Vout1_m and Vout2_m are measured to ensure that the measured values fall within allowable error from the target voltage values Vout1_s and Vout2_s.

This adjusting procedure requires a costly laser trimming device and some man-hours for resistance adjusting work, thus leading to higher manufacturing cost. Because re-adjustment is impossible once the trimming is conducted, an additional unsolved problem is present in that the procedure involves to some extent a percentage of defective units.

To cope with this problem, methods are known to conduct temperature compensation of the chip temperature measuring circuit by an electronic process.

Japanese Patent No. 4141444 and Japanese Patent No. 4229945, for example, disclose an onboard engine control device provided with a micro-processor having a non-volatile memory that stores a control program and control constants written in through an external tool, and a RAM memory for operational processing. This onboard engine control device comprises a constant voltage power supply circuit, a temperature sensor, and a multi-channel AD converter.

The non-volatile memory further stores calibration data and conversion data. The calibration data is the results of measurement with an externally equipped instrument and transferred through an external tool to write-in to the non-volatile memory in the adjusting operation stage of the onboard engine control device. The calibration data include externally measured data about the temperature around the constant voltage power supply circuit estimated from the environment temperature at the time of adjusting operation and about the actual output voltage of the constant voltage power supply circuit at the time of adjusting operation.

The conversion data include the data about variation characteristics of the environment temperature versus output voltage of the constant voltage power supply circuit, the data being actually measured in advance on multiple of products and statistically processed to obtain averaged voltage variation characteristics.

An output voltage of the constant voltage power supply circuit under a different temperature environment is estimated from a detected output of the temperature detecting sensor referring to the calibration data and the conversion data. The estimated output voltage is divided by the constant voltage to obtain a correction factor, by which is multiplied a digitalized value of an analogue input voltage to obtain a corrected digital voltage value.

Japanese Unexamined Patent Application Publication No. 2008-116233 discloses a method of calibrating an output of a temperature detecting diode of a switching element. The calibration in the above reference is conducted with a temperature correction factor based on a detected motor temperature after combining the motor and a detected temperature of the switching element. Temperature characteristics of the temperature detecting diode and the calibration factor (the temperature correction factor) are stored in a memory or other recoding medium.

Japanese Unexamined Patent Application Publication No. 2005-333667 discloses a semiconductor device that comprises a temperature detecting means that detects an operating temperature of a semiconductor switching element, an overheat protecting means that stops operation of the semiconducting switching element if a detected signal of the temperature detecting means exceeds a prescribed trip level stored in a non-volatile memory, and a characteristic correction means that corrects the trip level.

Japanese Unexamined Patent Application Publication No. 2004-117111 discloses a technology in which a temperature measuring diode is formed in a semiconductor element and temperature data is obtained at the position of the temperature measuring diode from the temperature characteristics of forward voltage drop of the temperature measuring diode. On the other hand, a sense current flowing through a current sense emitter is measured with a current detecting circuit and a corrected temperature is calculated in an operating unit based on the sense current value. The operating unit obtains a junction temperature by adding a temperature correction to the temperature data. A table of temperature correction is stored in a memory for current values detected with the current detecting circuit. Upon receiving a current value detected with the current detecting circuit, a temperature correction is calculated referring to the table.

In the conventional technology disclosed in Japanese Patent No. 4141444 and Japanese Patent No. 4229945, conversion data, which is temperature-output voltage characteristic in standard characteristics, is stored in a non-volatile memory. In the technology also stored is calibration data, which includes calibration temperature on an adjusting operation stage of the onboard engine control device and output voltage at the calibration temperature. When an actual temperature is measured, a constant voltage output at the actual measurement temperature is calculated according to a predetermined calculation formula referring to the calibration data and the conversion data stored in the non-volatile memory. The calculated constant voltage output is divided by a reference voltage to calculate a correction factor, by which a digitalized voltage is multiplied to obtain a corrected digital voltage.

Therefore, a non-volatile memory must store the calibration data and the conversion data, increasing memory capacity. In addition, the calculation operation needs to be repeated referring to the calibration data and the conversion data every time the actual temperature changes, increasing calculation operation load.

In the conventional technology disclosed in Japanese Unexamined Patent Application Publication No. 2008-116233, with a motor driving device combined, the difference between the motor temperature calculated in a motor temperature calculating section and the switching element temperature calculated in a switching element temperature calculating section is stored in a memory or other recording medium as a calibration value or a temperature correcting factor for correcting the calculation result in the switching element temperature calculating section. Offset correction is conducted by correcting the output from the diode for switching element temperature detection using the calibration value (or the temperature correcting factor). In the conventional technology of Japanese Unexamined Patent Application Publication No. 2008-116233, however, the calibration value is simply added to the output from the diode for switching element temperature detection. Therefore, the technology cannot be applied to a case where a gradient of the temperature-output voltage characteristic line is varied.

In the conventional technology disclosed in Japanese Unexamined Patent Application Publication No. 2005-333667, correction of the trip level that is the basis for decision of overheating is conducted by selecting the number of capacitors that are connected according to a characteristic correction signal written in an EPROM. Therefore, this technology also cannot be applied to a case where a gradient of the temperature-output voltage characteristic line is varied.

In the conventional technology disclosed in Japanese Unexamined Patent Application Publication No. 2004-117111, temperature correction is calculated based on the sense current flowing through the current sensing emitter of the semiconductor element referring to the table of current versus temperature correction stored in a memory. The temperature correction is added to a temperature data obtained by a temperature detecting circuit to calculate a junction temperature. Therefore, this technology also cannot be applied to a case where a gradient of the temperature-output voltage characteristic is varied.

SUMMARY OF THE INVENTION

The present invention has been made in view of the above-described unsolved problems in the conventional technologies, and an object of the invention is to provide such a temperature measuring device of a power semiconductor apparatus that performs temperature detection readily and accurately even in the case where a gradient of temperature-output voltage characteristic is different for an actually measured characteristic from a gradient for designed characteristic.

In order to accomplish the above-described object, a temperature measuring device of a power semiconductor apparatus of a first aspect of the present invention is a temperature measuring device of a power semiconductor apparatus comprising a chip temperature detecting circuit for detecting a chip temperature of a power switching element of the power semiconductor apparatus having a power switching element and a temperature detecting diode on a silicon chip. The chip temperature detecting circuit comprises a constant current source for supplying constant current to the temperature detecting diode, an A/D converter for delivering a measurement value that is a digital converted forward voltage across the temperature detecting diode, an operational processing unit for calculating the chip temperature based on the measurement value that is delivered from the A/D converter and received by the operational processing unit, and a memory for storing data for use in the operational processing unit. The operational processing unit comprises a calibration processing section and a chip temperature calculating section. The memory stores a gradient value calculated by the calibration processing section and an offset correction value that is one of measurement values delivered from the A/D converter. The calibration processing section conducts calibration of error in the chip temperature detecting circuit connecting a reference voltage source that applies different known reference voltages in place of the temperature detecting diode, and the calibration processing section also calculates the gradient that is a gradient of a line segment connecting measurement values delivered from the A/D converter when the reference voltages are applied and delivers the calculated gradient of the line segment and the offset correction value to the memory. The chip temperature calculating section calculates the chip temperature according to a corrected measurement value that is calculated based on a measurement value delivered from the A/D converter in a process of temperature measurement with the temperature detecting diode and also based on the gradient value of the line segment and the offset correction value that are stored in the memory.

A second aspect of the present invention is a temperature measuring device of a power semiconductor apparatus wherein the calibration processing section conducts measurement plural times to obtain measurement values from the A/D converter applying the reference voltage and takes a mean value of the plural times of measurement as the measurement value for use in calibration processing and chip temperature calculation processing.

A third aspect of the present invention is a temperature measuring device of a power semiconductor apparatus that has a power switching element and a temperature detecting diode on a silicon chip of the apparatus. The temperature measuring device comprises a chip temperature detecting circuit for detecting a chip temperature of the power switching element. The chip temperature detecting circuit comprises: a constant current source for supplying constant current to the temperature detecting diode, a pulse width modulation circuit for delivering a pulse width modulation signal that is generated from an input signal of a forward voltage across the temperature detecting diode, an isolated transmission circuit for transmitting the pulse width modulation signal delivered from the pulse width modulation circuit performing electrical insulation, a low pass filter for smoothing a signal delivered through the isolated transmission circuit, an A/D converter for delivering a measurement value that is a digital converted filter output signal from the low pass filter, an operational processing unit for calculating the chip temperature based on the measurement value that is delivered from the A/D converter and received by the operational processing unit, and a memory for storing data for use in the operational processing unit. The operational processing unit comprises a calibration processing section, and a chip temperature calculating section. The memory stores a gradient value calculated by the calibration processing section and an offset correction value that is one of measurement values delivered from the A/D converter. The calibration processing section conducts calibration of error in the chip temperature detecting circuit having a reference voltage source that applies different known reference voltages connected in place of the temperature detecting diode, and the calibration processing section also calculates the gradient that is a gradient of a line segment connecting measurement values delivered from the A/D converter when the reference voltages are applied and delivers the calculated gradient of the line segment and the offset correction value to the memory. And the chip temperature calculating section calculates the chip temperature according to a corrected measurement value that is calculated based on a measurement value delivered from the A/D converter in a process of temperature measurement with the temperature detecting diode and also based on the gradient value of the line segment and the offset correction value that are stored in the memory.

A fourth aspect of the present invention is the temperature measuring device of a power semiconductor apparatus of the third aspect of the invention wherein the calibration processing section conducts sampling for measurement values delivered from the A/D converter on application of the reference voltage in a period of an integer times of an oscillation period of a triangular wave generating circuit included in the pulse wave modulation circuit and takes a mean value of the sampled measurement values as the measurement value for use in calibration processing and chip temperature calculation processing.

A fifth aspect of the present invention is the temperature measuring device of a power semiconductor apparatus wherein the memory is a non-volatile memory formed in the operational processing unit.

A sixth aspect of the present invention is the temperature measuring device of a power semiconductor apparatus wherein the calibration processing section sets the different known reference voltages within a range of forward voltages across the temperature detecting diode at the maximum and the minimum temperatures of chip temperature measurement.

A seventh aspect of the present invention is the temperature measuring device of a power semiconductor apparatus wherein the calibration processing section sets the minimum and the maximum values of the different known reference voltages to be equal or close to the forward voltage values across the temperature detecting diode at the highest and the lowest temperatures of a measurement range of the chip temperature.

According to the present invention, in calibration processing, a reference voltage source is connected in place of a temperature detecting diode and a plurality of known reference voltages are applied by the reference voltage source. A gradient of a line segment connecting a point of a measured value of an A/D converter for one of the reference voltages and a point of another measured value of the A/D converter for another of the reference voltages is calculated and stored in a memory. An offset correction value, which is one of the measured values of the A/D converter, is also recorded in the memory. In temperature measurement processing with the temperature detecting diode, correction operation is executed to a measured output value of the A/D converter based on the gradient of the line segment and the offset correction value that are stored in the memory. Consequently, a gradient of the line segment based on the characteristics of the chip temperature detecting circuit can be readily calculated in a calibration processing section using a plurality of known reference voltages. In correction processing for measured values, a corrected measurement value can be calculated through simple operation based on the recorded gradient of the line segment and the offset correction value and the measured output value of the A/D converter. Therefore, calculation operation load is reduced in the operational processing section.

DETAILED DESCRIPTION OF THE INVENTION

Some preferred embodiments according to the present invention will be described in the following with reference to the accompanied drawings.

Now, a first aspect of an embodiment of a temperature measuring device of a power semiconductor apparatus of the invention is described with reference to FIG. 1, which is a block diagram showing a schematic construction of an intelligent power module (IPM) to which the present invention is applied.

Figure 1:
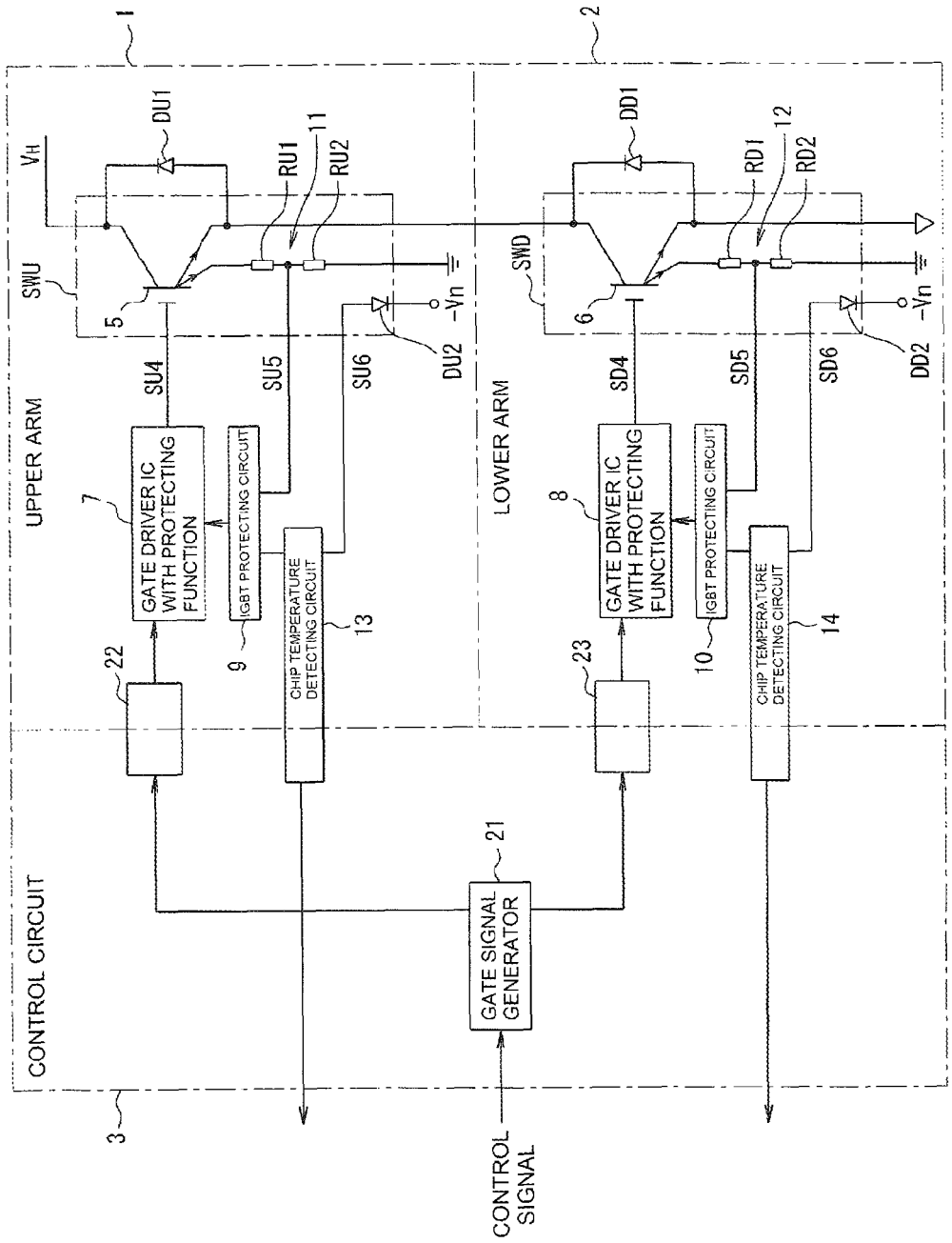
FIG. 1 is a block diagram showing schematic construction of an intelligent power module for a buck-boost converter to which the present invention can be applied.

Referring to FIG. 1, the intelligent power module comprises an upper arm 1 and a lower arm 2, which control electric current flow to the load. The upper arm 1 and the lower arm 2 have power switching elements SWU and SWD, respectively, to pass or interrupt the current to the load. A control circuit 3 including a gate signal generator 21 generates control signals to instruct a conducting state or a non-conducting state of the switching elements SWU and SWD. The control circuit 3 can be composed of a CPU, a logic IC, or a system LSI installing logic ICs and a CPU. Signals are transmitted between the high and low voltage circuits through photo-couplers 22 and 23.

Figure 12:
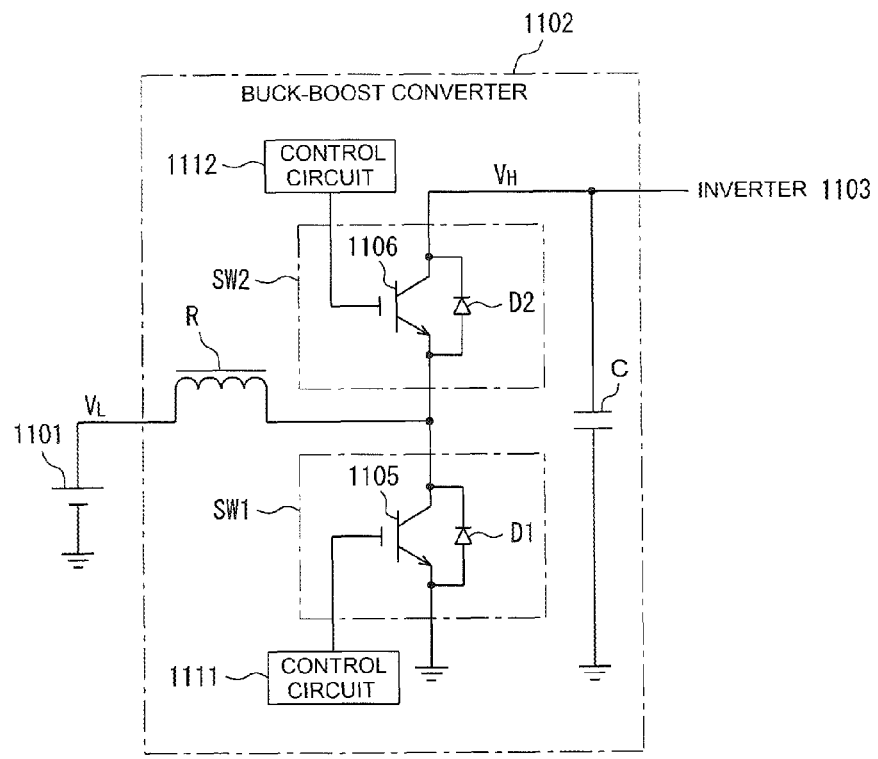
FIG. 12 is a block diagram showing construction of a buck-boost converter in the vehicle driving system.
Figure 13:
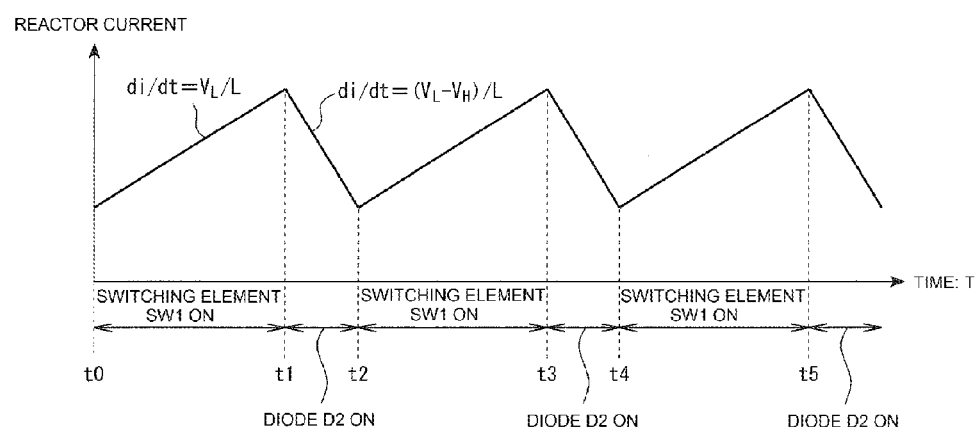
FIG. 13 shows a waveform of the current flowing in the reactor in step-up operation of the buck-boost converter.
Figure 14:
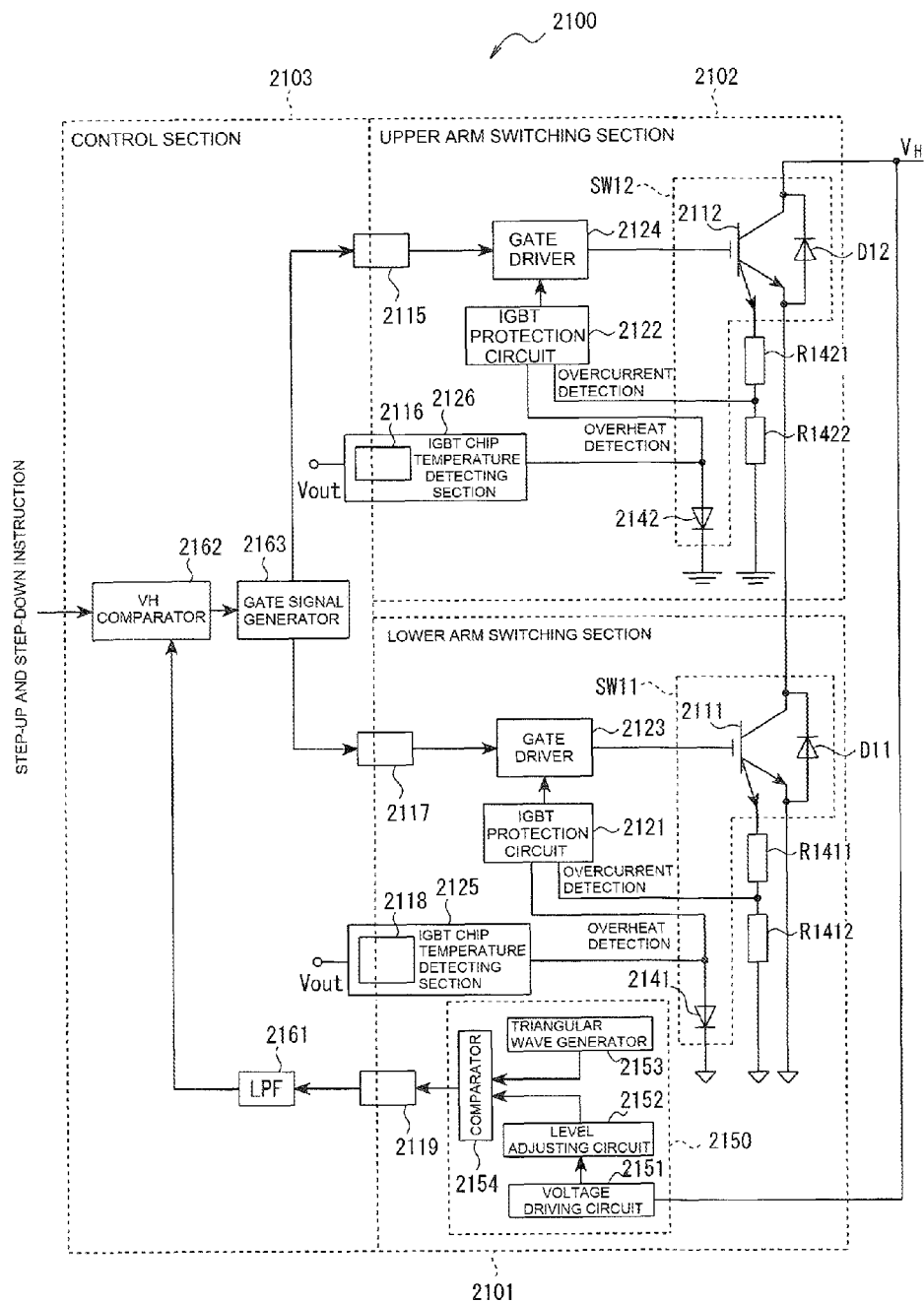
FIG. 14 is a block diagram showing a construction of an intelligent power module (IPM) for the buck-boost converter.
Figure 15:
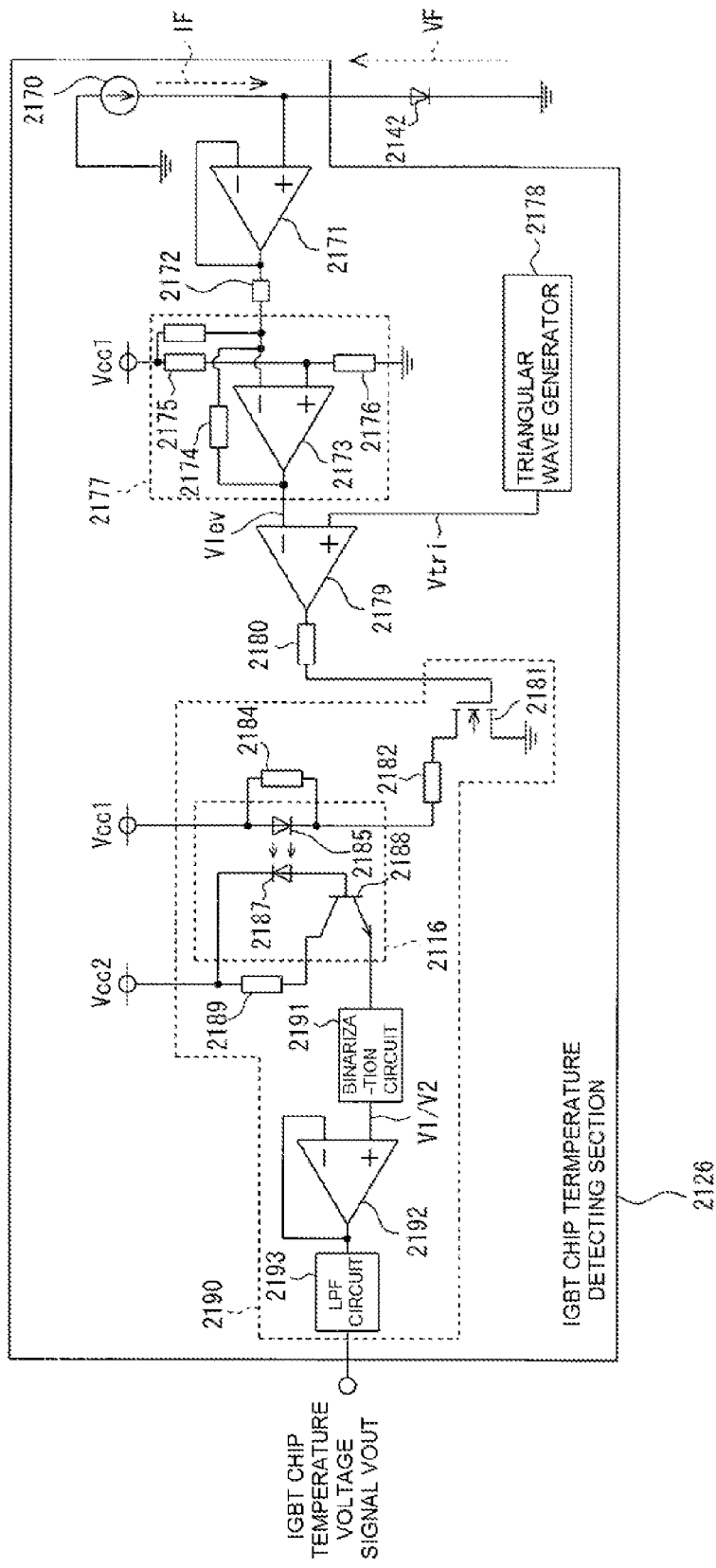
FIG. 15 is a block diagram showing a construction of an IGBT chip temperature detecting section in an IPM for the buck-boost converter.
Figure 16:
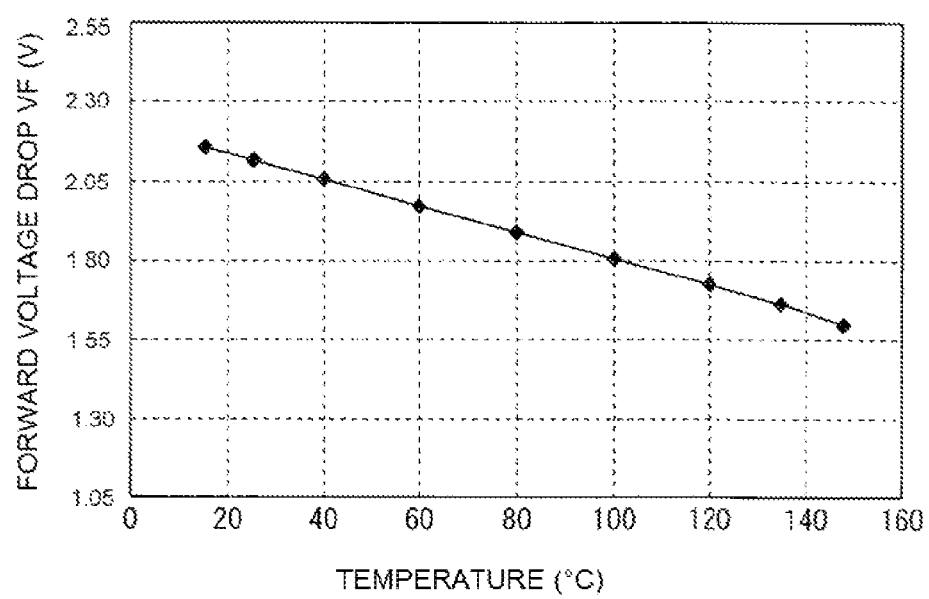
FIG. 16 shows temperature characteristics of forward voltage across an IGBT chip temperature detecting diode in the IGBT chip temperature detection section.
Figure 17:
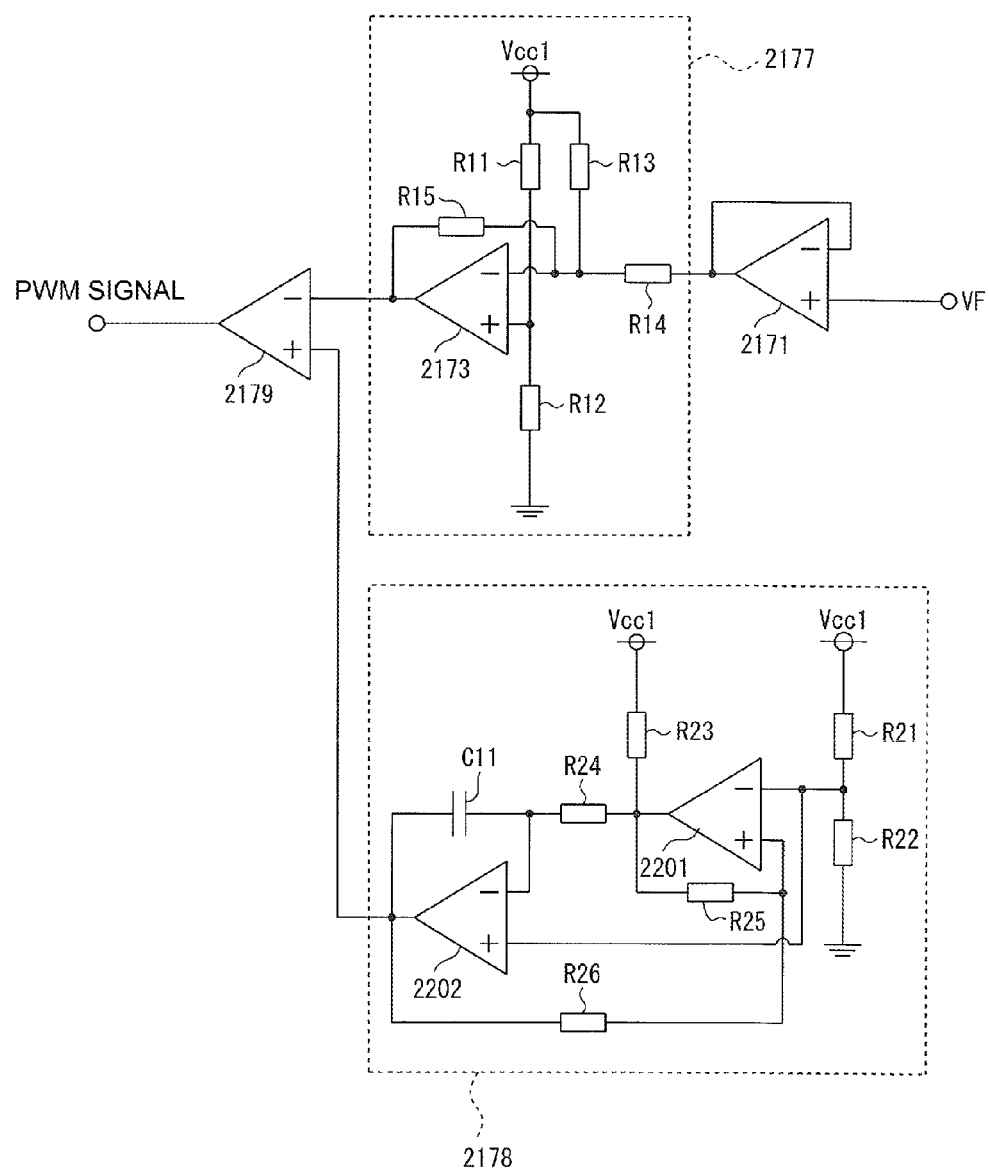
FIG. 17 is a circuit diagram showing a construction of VF/PWM conversion circuit using a conventional level converter.

The power switching element SWU in the upper arm 1 and the power switching element SWD in the lower arm 2 are connected in series, and the connection point between the switching elements is lead out of the IPM, though not shown in FIG. 1. By connecting a reactor to the series connection point between the power switching elements SWU and SWD, as shown in FIG. 12, a buck-boost converter can be constructed using the IPM of FIG. 1. Or using three sets of this type of IPM, a three phase inverter can be constructed by connecting a DC power supply to the ends of the series-connected power switching elements SWU and SWD and leading out AC output terminals from the series connection points between the power switching elements SWU and SWD.

The IPM shown in FIG. 1 has a so-called two-in-one structure that packages one set of series circuit of the power switching elements SWU and SWD of the upper arm 1 and the lower arm 2, respectively. Different from this structure, an IPM with a so-called six-in-one structure can be constructed that packages three sets of the series-connected circuit of the power switching elements SWU and SWD of the upper arm 1 and the lower arm 2.

The power switching element SWU in the upper arm 1 comprises an IGBT 5 that performs switching operation according to a gate signal SU4 and a freewheeling diode DU1 connected in parallel to the IGBT 5 to have electric current flowing in the direction opposite to the current in the IGBT 5. The silicon chip having the IGBT 5 formed therein includes a temperature detecting diode DU2 for giving a forward voltage corresponding to the chip temperature. An anode of temperature detecting diode DU2 is connected to a negative voltage −Vn. 13 and The silicon chip for the IGBT 5 is provided with a second emitter terminal of the IGBT 5 to detect emitter current, a portion of which is divided away to flow through shunt resistances RU1 and RU2 that comprise an overcurrent detecting circuit 11.

The power switching element SWD in the lower arm 2 comprises an IGBT 6 that performs switching operation according to a gate signal SD4 and a freewheeling diode DD1 connected in parallel to the IGBT 6 to have electric current flowing in the direction opposite to the current in the IGBT 6. The silicon chip having the IGBT 6 formed therein includes a temperature detecting diode DD2 for giving a forward voltage corresponding to the chip temperature. An anode of temperature detecting diode DD2 is connected to a negative voltage −Vn. The silicon chip for the IGBT 6 is provided with a second emitter terminal of the IGBT 6 to detect emitter current, a portion of which is divided away to flow through shunt resistances RD1 and RD2 that construct an overcurrent detecting circuit 12.

Figure 2A:
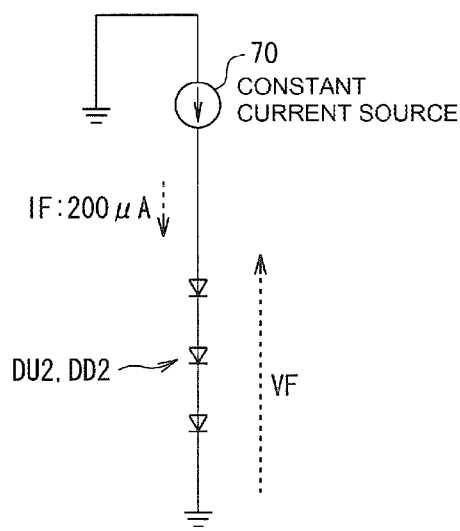
FIG. 2A is a circuit diagram showing a temperature detecting diode composed of three diode elements and a constant current source for supplying constant current to the temperature detecting diode.
Figure 2B:
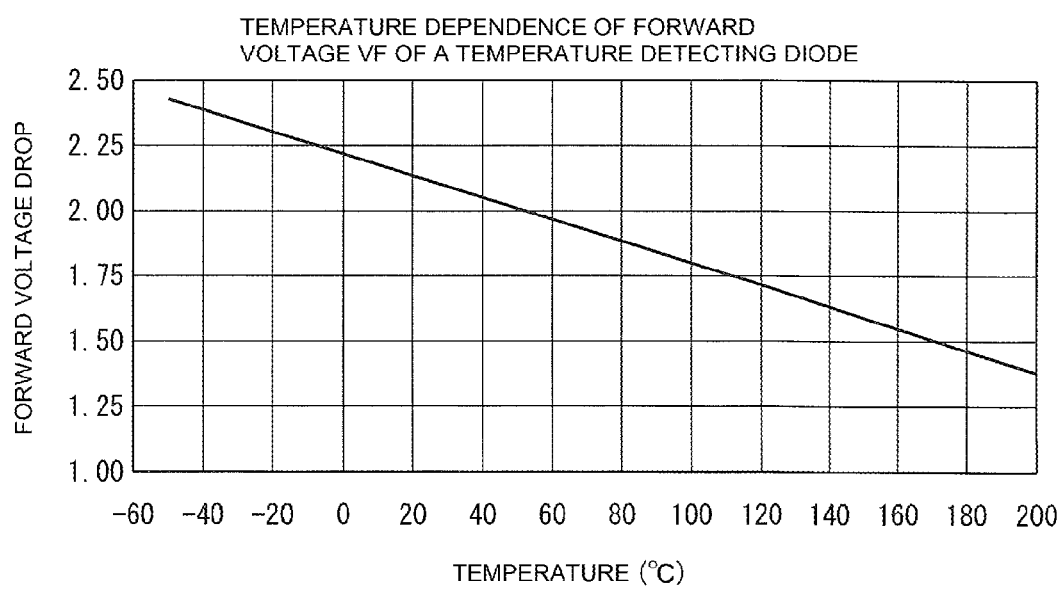
FIG. 2B is a characteristic chart showing graphically the map of silicon chip temperature giving the relationship between the forward voltage of the temperature detecting diode and the silicon chip temperature.

Each of the temperature detecting diodes DU2 and DD2 is composed of three series-connected diodes as shown in FIG. 2A because a single diode exhibits a forward voltage of only 0.5 V to 0.7 V which is too low to handle easily. The series-connected three diodes is set to exhibit a forward voltage of 1.38 V at a chip temperature of 200° C. and 2.43 V at −50° C. as shown in FIG. 2B.

In the side of the upper arm 1, a gate driver IC 7 is provided to generate the gate signal SU4 for driving a control terminal of the IGBT 5. In the side of the upper arm 1 further provided is a chip temperature detecting circuit 13 that contains a constant current source for supplying a constant current of 200 μA, for example, to the temperature detecting diode DU2 and monitors an overheat detecting signal SU6, which is a forward voltage VF across the temperature detecting diode DU2. In the side of the upper arm 1 also provided is an IGBT protecting circuit 9 that monitors an overcurrent detecting signal SU5 from the overcurrent detecting circuit 11 and generates an IGBT protecting signal that is delivered to the gate driver IC 7.

In the side of the lower arm 2, a gate driver IC 8 is provided to generate a gate signal SD4 for driving a control terminal of the IGBT 6. In the side of the lower arm 2 further provided is a chip temperature detecting circuit 14 that contains a constant current source for supplying a constant current of 200 μA, for example, to the temperature detecting diode DD2 and monitors an overheat detecting signal SD6, which is a forward voltage VF across the temperature detecting diode DD2. In the side of the lower arm 2 also provided is an IGBT protecting circuit 10 that monitors an overcurrent detecting signal SD5 from the overcurrent detecting circuit 12 and generates an IGBT protecting signal that is delivered to the gate driver IC 8.

The IGBT protecting circuits 9 and 10 deliver, to the gate driver ICs 7 and 8, IGBT protecting signals to interrupt output of gate signals if the electric current values given by the overcurrent detecting signals SU5 and SD5 exceed a predetermined current value boy.

Figure 3:
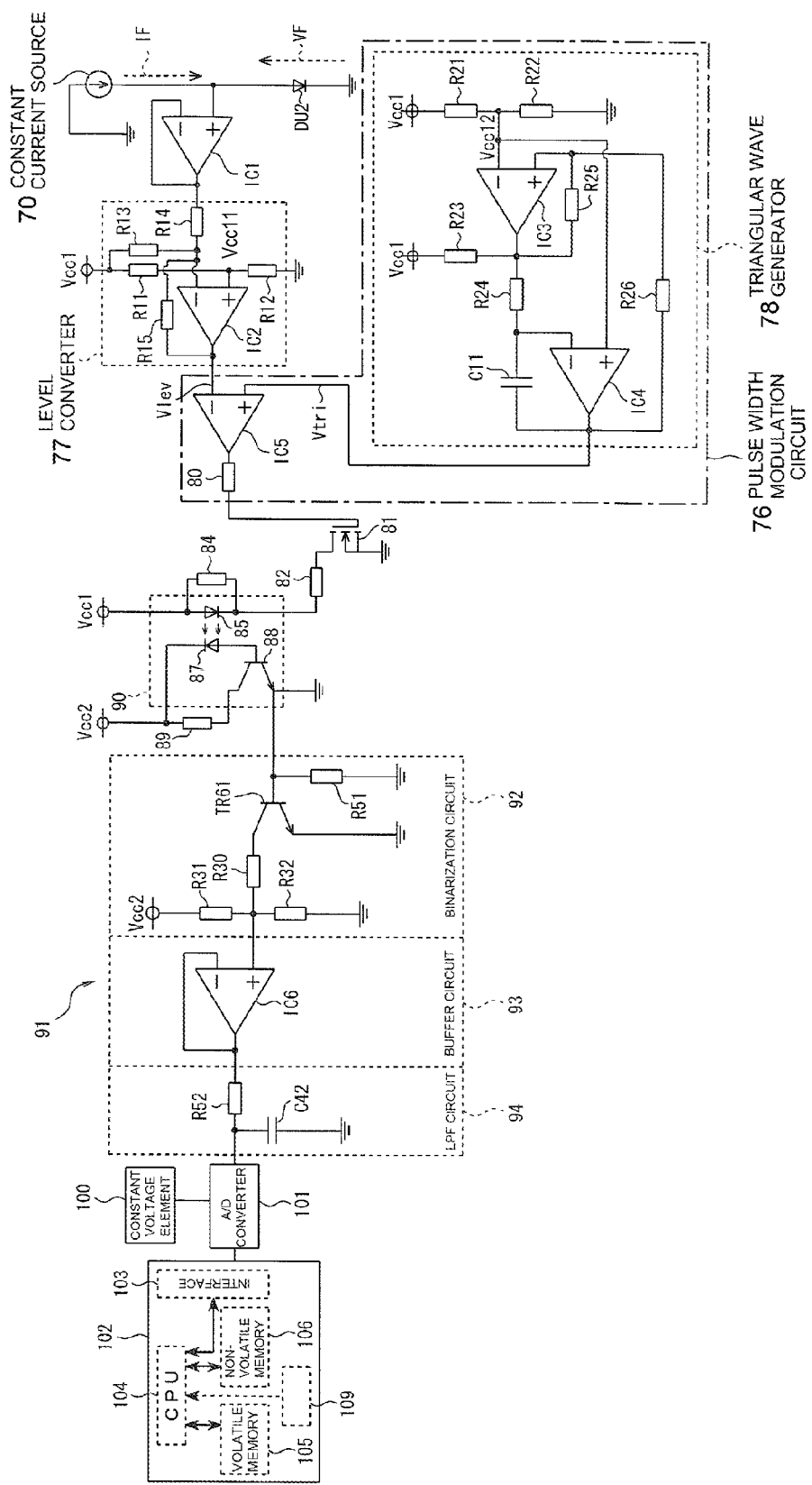
FIG. 3 is a circuit diagram of a specific construction of a chip temperature detecting circuit in the first embodiment according to the present invention.

Chip temperature detecting circuits 13 and 14 have the same circuit construction, so only the chip temperature detecting circuit 13 is described, which is representative of both circuits. Referring to FIG. 3, which shows a construction of the chip temperature detecting circuit 13, constant current IF is supplied by a constant current source 70 to the temperature detecting diode DU2. A forward voltage VF developed across the temperature detecting diode DU2 undergoes impedance conversion in a buffer amplifier IC1 and is delivered to a level converter 77, which in turn outputs a level-adjusted voltage Vlev.

The level converter 77 has an operational amplifier IC2, which receives, at an inversion input terminal thereof, the output signal of the buffer amplifier IC1 through a resistance R14. The non-inversion input terminal receives the voltage Vcc11 that is a divided voltage of a DC power supply Vcc1 with shunt resistances R11 and R12. The DC power supply Vcc1 is connected, through a resistance R13, to the point between the inversion input terminal and the resistance R14. The inversion input terminal and the output terminal of the operational amplifier IC2 is connected through a resistance R15.

The output voltage Vlev of the level converter 77 is given by the equation (8) below.

$$V_{lev} = V_{cc11} - R_{15}\left(\frac{V_{cc1} - V_{cc11}}{R_{13}} + \frac{V_F - V_{cc11}}{R_{14}}\right) \qquad (8)$$

This level conversion is a linear conversion.

The chip temperature detecting circuit 13 comprises a pulse width modulation circuit 76, which includes a triangular wave generating circuit 78 generating a triangular wave signal Vtri and a comparator 105.

The triangular wave generating circuit 78 comprises a comparator IC3 and an operational amplifier IC4 that constructs an integration circuit and receives an output signal from the comparator IC3. The inversion input terminal of the comparator IC3 receives a voltage Vcc12 that is a divided voltage of the DC power supply Vcc1 with shunt resistances R21 and R22. The non-inversion input terminal of the comparator IC3 is connected to the output terminal of the operational amplifier IC4 through a resistance R26. The non-inversion input terminal of the comparator IC3 is also connected to the output terminal of the comparator IC3 through a resistance R25.

The DC power supply Vcc1 is connected to the output terminal of the comparator IC3 through a resistance R23; and the output terminal of the comparator IC3 is connected to the inversion input terminal of the operational amplifier IC4 through a resistance R24.

A capacitor 11 for integration is connected between the inversion input terminal and the output terminal of the operational amplifier IC4.

The output voltage Vlev level-adjusted in the level converter 77 and the triangular wave signal Vtri delivered from the triangular wave generating circuit 78 are given to a comparator IC5. The comparator IC5 compares the output voltage Vlev and the triangular wave signal Vtri and outputs a PWM signal that is at a high level when Vlev<Vtri and at a low level when Vlev≥Vtri.

The PWM signal delivered from the comparator IC5 is transmitted, through an isolated transmission circuit composed of a photo-coupler 90 for PWM signal transmission on the next stage, to a PWM-analogue conversion circuit 91 as a PWM signal for temperature detection. Thus, the PWM signal is transmitted from the side of the upper arm 1 (or the lower arm 2) to the side of the control circuit 3 via an isolated transmission path.

Figure 18:
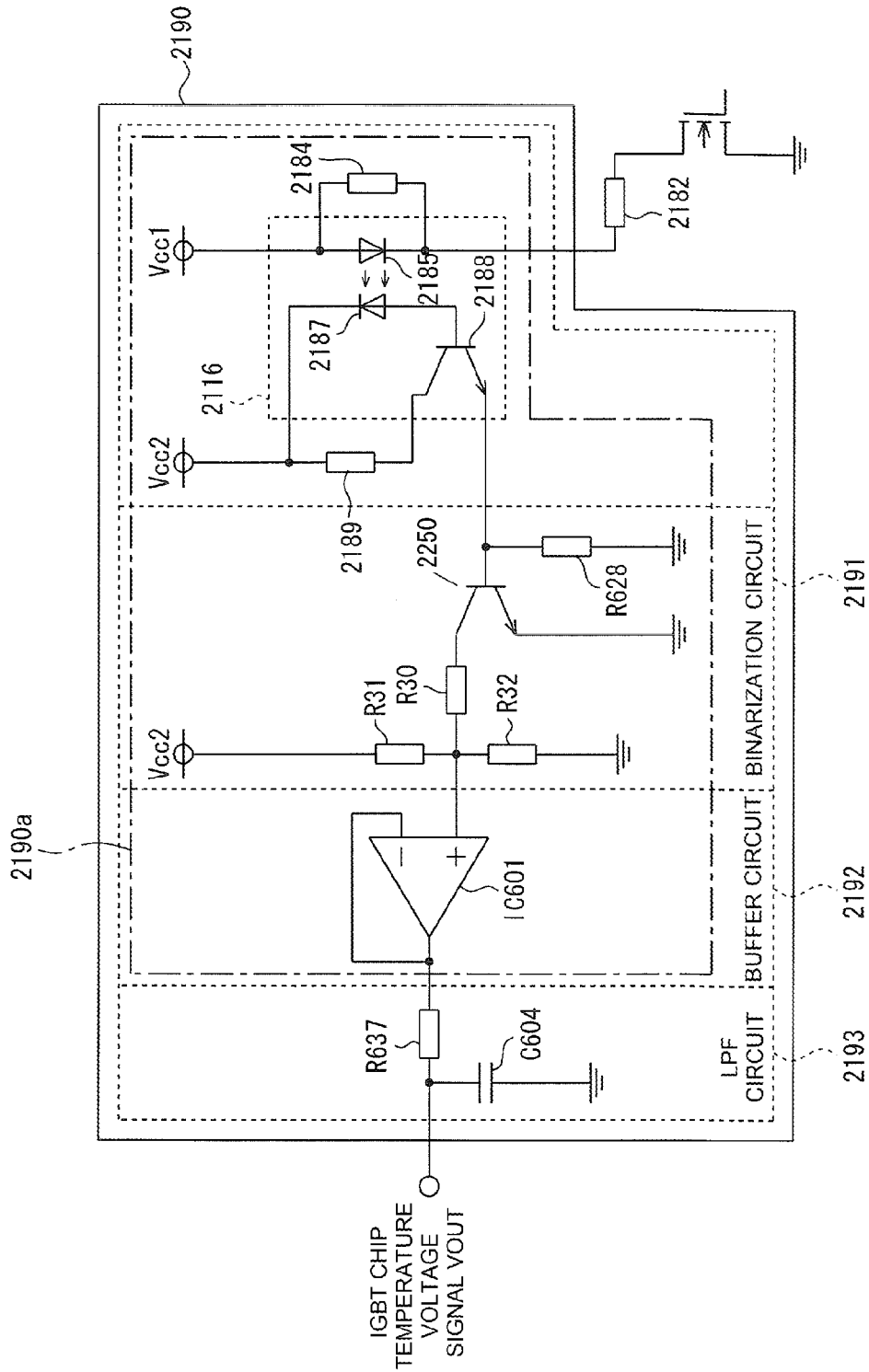
FIG. 18 is a circuit diagram showing a construction of PWM-analogue converter in an IPM for a buck-boost converter.
Figure 19:
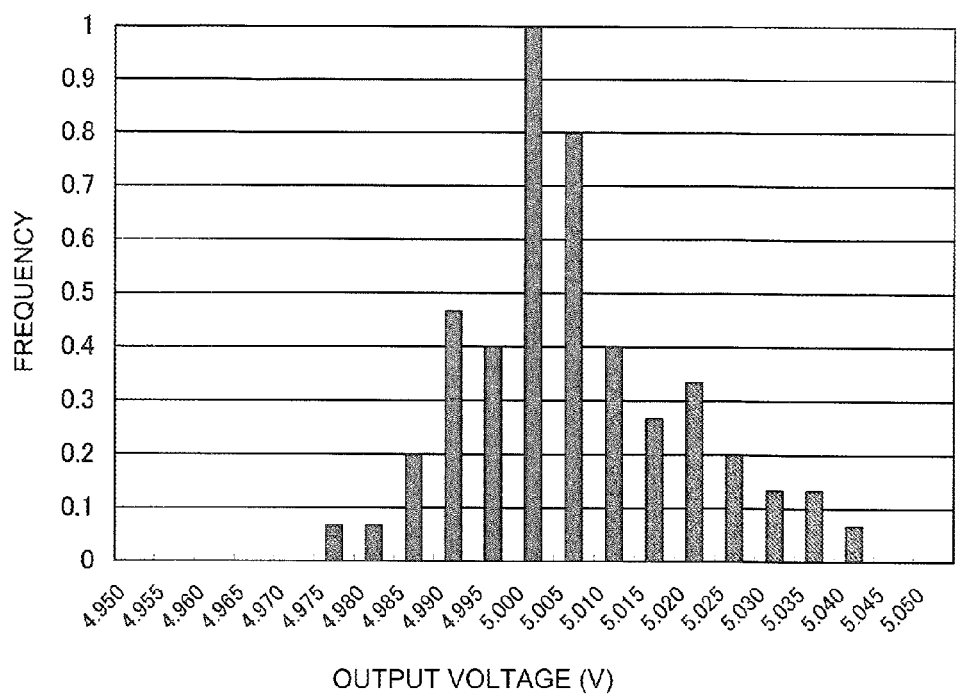
FIG. 19 shows the distribution of power supply voltage when a shunt regulator is used for the first power supply of an IPM for a conventional buck-boost converter.
Figure 20:
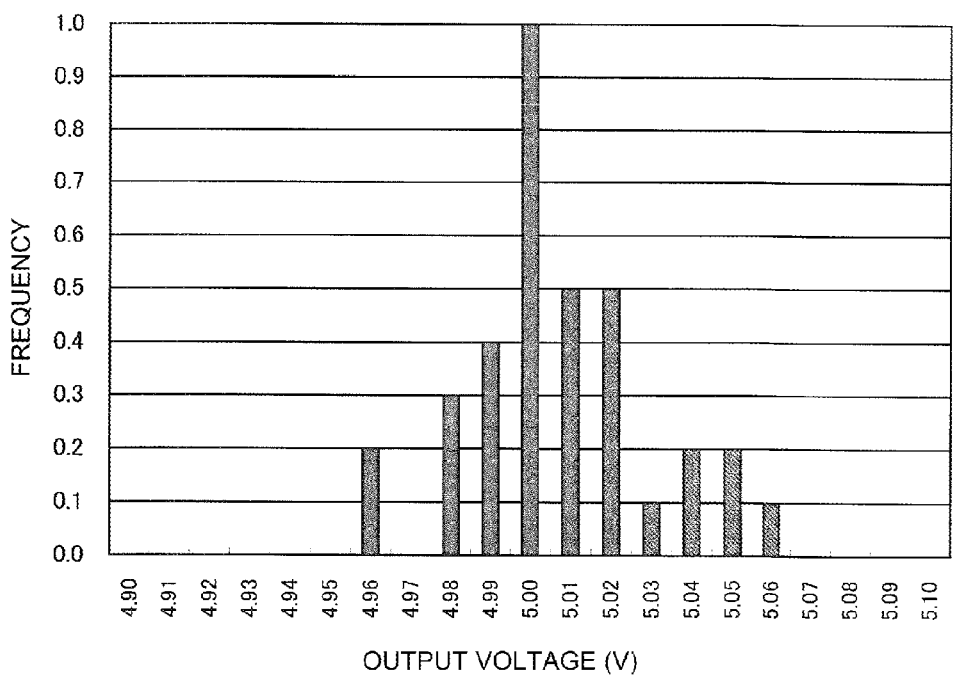
FIG. 20 shows the distribution of power supply voltage when a high accuracy voltage regulator is used for the second power supply of an IPM for a conventional buck-boost converter.
Figure 21:
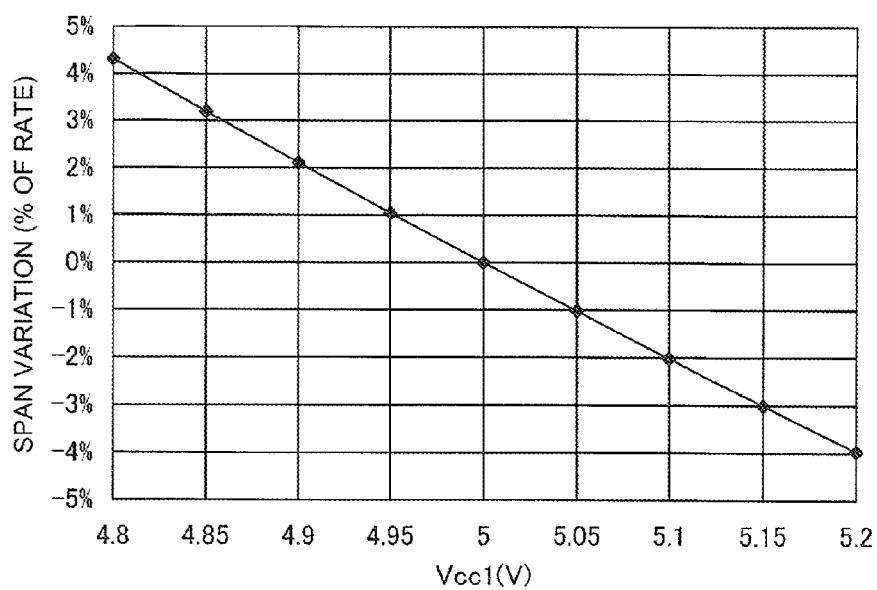
FIG. 21 shows span variation of voltage signals of IGBT chip temperature when the voltage of the first power supply is changed.
Figure 22:
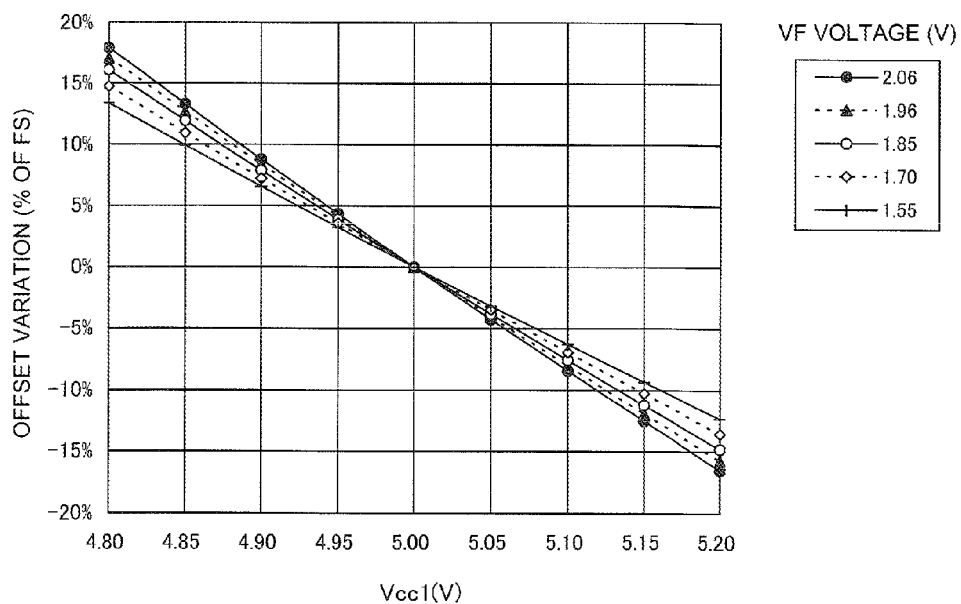
FIG. 22 shows offset variation of voltage signals of IGBT chip temperature when the voltage of the first power supply is changed.
Figure 23:
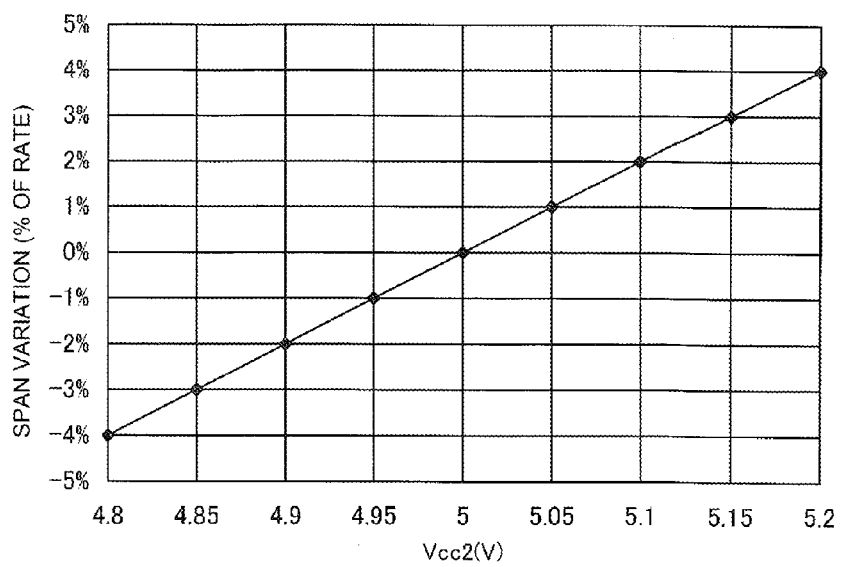
FIG. 23 shows span variation of voltage signals of IGBT chip temperature when the voltage of the second power supply is changed.
Figure 24:
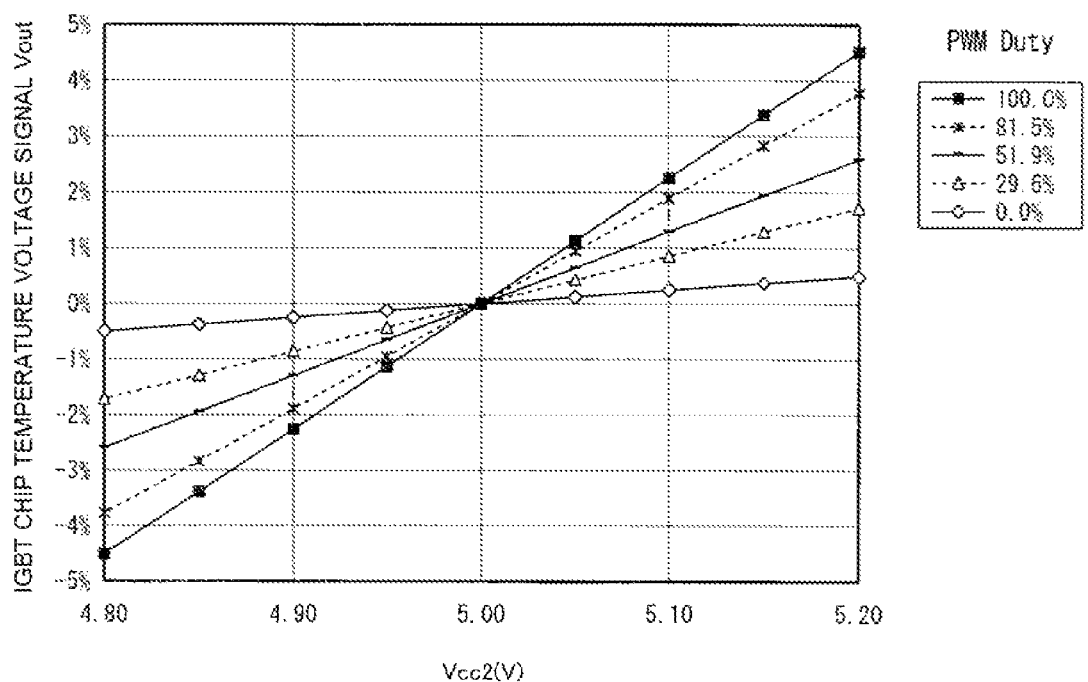
FIG. 24 shows offset variation of voltage signals of IGBT chip temperature when the voltage of the second power supply is changed.

In this PWM-analogue conversion circuit 91, a PWM signal given from the photo-coupler 90 is delivered to a binarization circuit 92, comprising transistor TR61 and resistor R51, as well as resistors R30, R31 and R32 as in FIG. 18, for converting the PWM signal to a binary signal. The binarization circuit 92 generates binary signals that are a voltage V1 for a duty factor of 0% and a voltage V2 for a duty factor of 100%. The binary signal undergoes impedance conversion in the buffer circuit 93 and then smoothed in a low pass filter circuit 94 comprising resistor R52 and capacitor C42 to convert to a DC level signal. Thus, an IGBT chip temperature signal Vout is obtained corresponding to an IGBT chip temperature.

This IGBT chip temperature signal Vout is delivered to an A/D converter 101 that is provided with a constant voltage from a constant voltage element 100 and converts the Vout signal to an output digital value of a measurement value Vout_m. The measurement value from the A/D converter 101 is delivered to a microcomputer 102, which is an operational processing section.

This microcomputer 102 comprises an interface circuit 103 connected to the A/D converter 101 and a central processing unit (CPU) 104 that processes the measurement value given through the interface circuit 103. The microcomputer 102 further comprises a volatile memory 105 that is composed of ROMs and RAMs for storing programs to run in the CPU 104 and resulted data, and a non-volatile memory 106 that stores a gradient of a line segment and an offset correction value calculated in a calibration processing section, which will be described later.

Figure 4:
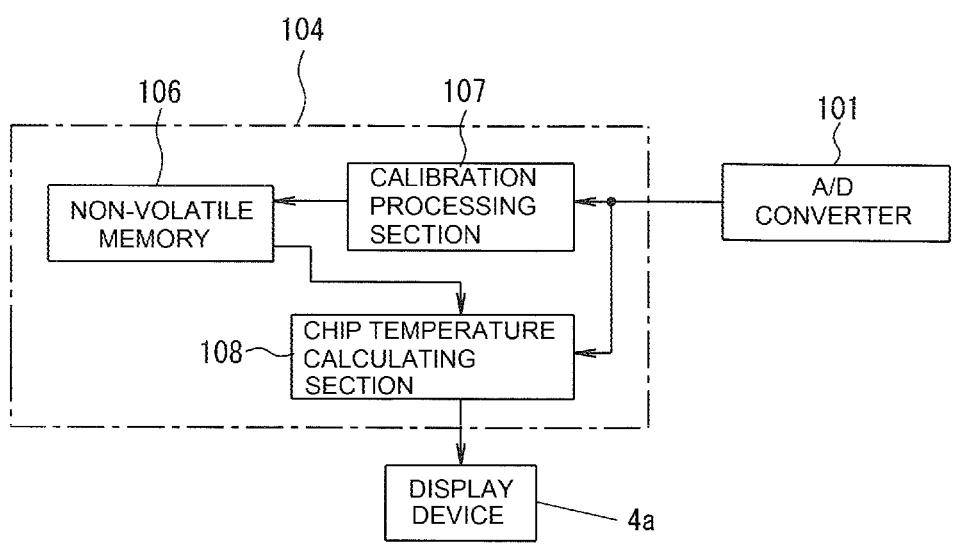
FIG. 4 is a block diagram showing functions of the central processing unit.

The CPU 104 of the microcomputer 102 comprises, as shown in FIG. 4 that is a functional block diagram of the CPU 104, at least a calibration processing section 107 and a chip temperature calculating section 108. Chip temperature calculating section 108 may be connected to a display device 4a. The non-volatile memory 106 can be provided separately from the central processing unit 104 as shown in FIG. 3 or installed within the central processing unit 104 as shown in FIG. 4.

Figure 5:
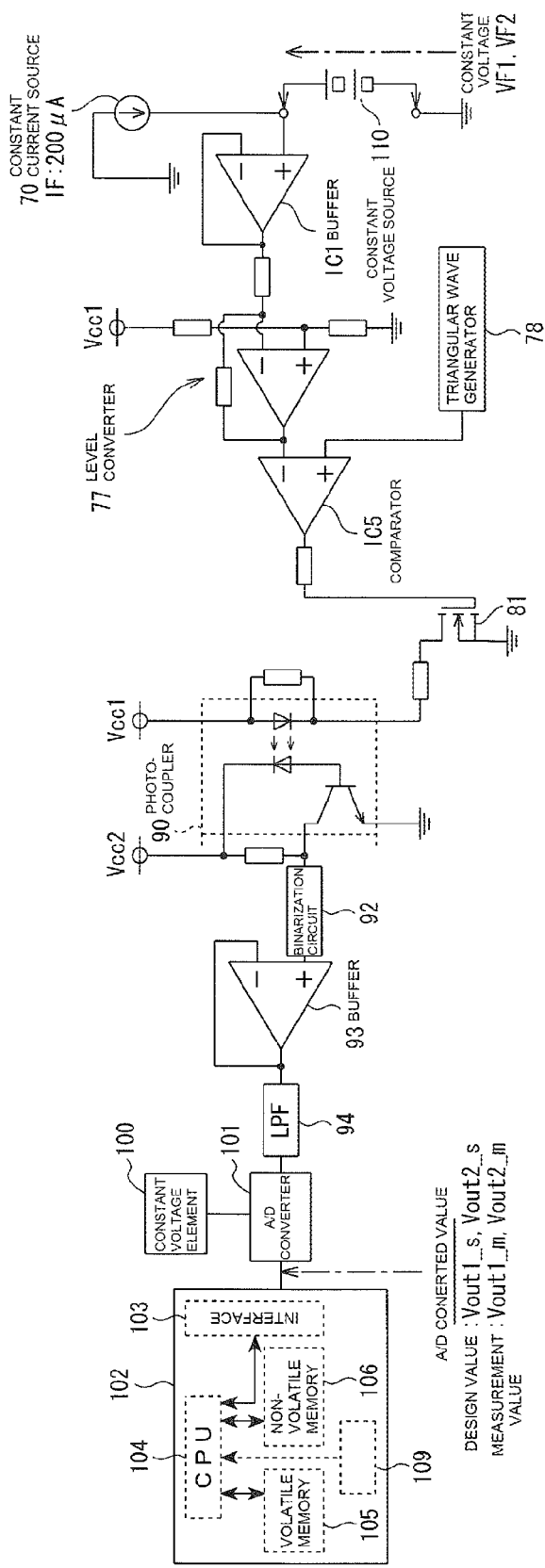
FIG. 5 is a circuit diagram of a specific construction of the chip temperature detecting circuit in calibration processing.

The calibration processing section 107 conducts calibration processing on an adjustment stage by connecting a constant voltage source 110 that can apply various voltages based on a voltage application instruction, between the terminals that are provided in the chip temperature detecting circuit 13 to connect an anode and a cathode of the temperature measuring diode DU2 as shown in FIG. 5.

In the calibration processing, two different known reference voltages are applied by the constant voltage source 110. The two reference voltages are set for example to be VF1=1.5298 V corresponding to a chip temperature of 155° C. and VF2=2.0619 V corresponding to 25° C.

Measurement value Vout1_m and Vout2_m, which are output values from the A/D converter 101 when the voltages VF1 and VF2 are applied, are read-in and a gradient α of the line segment connecting the point (VF1, Vout1_m) and the point (VF2, Vout2_m) is calculated. The non-volatile memory 106 stores the calculated gradient α and an offset correction value Vout1_m, which is one of the two measurement values Vout1_m and Vout2_m.

The chip temperature calculating section 108 reads-in a measurement value Vout_m that is delivered from the A/D converter 101 when the temperature detecting diode DU2 is actually connected, and executes calculation based on the measurement value Vout_m and the gradient α and the offset correction value Vout1_m, the latter two being stored in the non-volatile memory 106, to obtain a forward voltage VF of the temperature detecting diode DU2. The specific procedure of the calculation will be described afterward. The chip temperature calculating section 108 then calculates a chip temperature Tc based on the calculated forward voltage VF referring to the characteristic curve representing the relation between temperature and forward voltage of the temperature detecting diode DU2 shown in FIG. 2B.

Here, the A/D converted value should be represented using a hexadecimal code in principle, but for providing multiplicity of uses and ease of explanation, it is represented by a voltage value in the range from 0 to 5 V. The output signals from the PWM-analogue conversion circuit 91 are designed to be in the range from 4.5 to 0.5 V corresponding to the range of zero to 100% of ON duty factors of the pulse width modulation signal from the pulse width modulation circuit 76, which signal is an input to the PWM-analogue conversion circuit 91.

Figure 6:
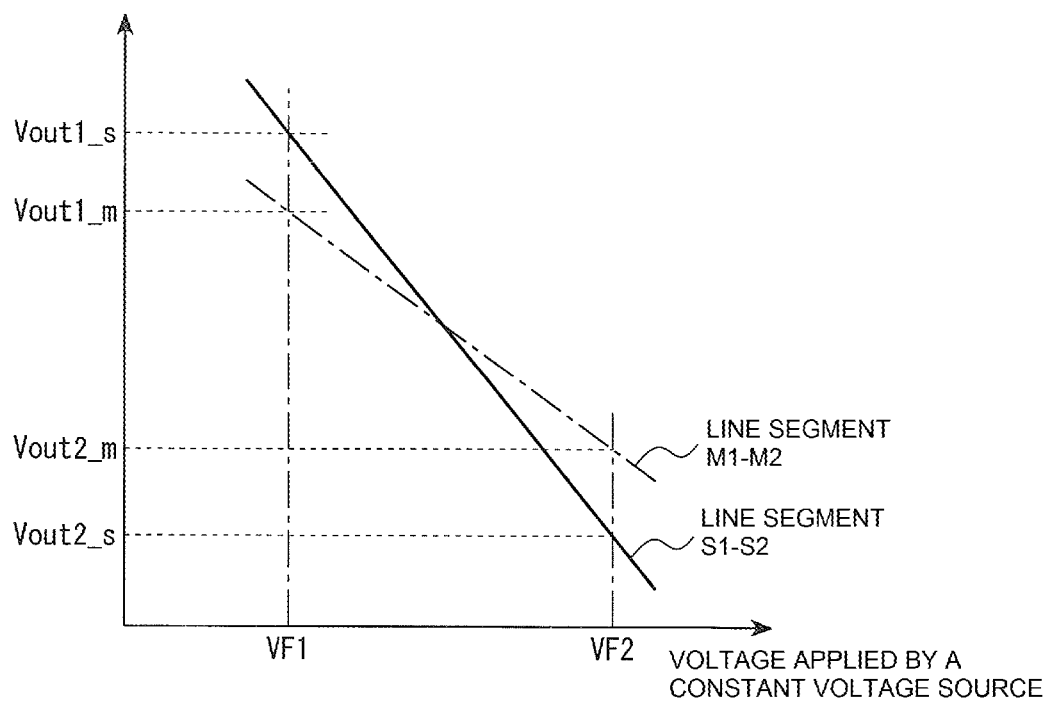
FIG. 6 is a characteristic chart showing the relationship between applied voltages from the constant voltage source and measurement values converted by the A/D converter.

FIG. 6 shows relationship between the measurement values from the A/D converter 101 and the voltages VF1 and VF2 applied by the constant voltage source 110. The range in which the relation is linear is from a voltage of 1.489 to 2.103 V corresponding to a chip temperature range of from +15° C. to +165° C. in the design, and the range of measurement values from the A/D converter is from 4.5 to 0.5 V. When a voltage VF1=1.5298 V corresponding to a chip temperature of 155° C. and a voltage of VF2=2.0619 V corresponding to a chip temperature of 25° C. are applied, measurement values obtained from the A/D converter 101 are Vout1_s=4.233 V for VF1=1.5298 V and Vout2_s=0.7667 V for VF2=2.0619 V in the design.

Based on the line segment connecting the measurement values Vout1_s and Vout2_s depicted with the solid line in FIG. 6, an input voltage VF can be obtained by reversed calculation from a measurement value Vout_s obtained from the A/D converter 101. The measurement value Vout_s is calculated according to the equation (9) below.

$$\text{Vout\_s} = \frac{(\text{Vout2\_s} - \text{Vout1\_s})}{(VF2 - VF1)} \times (VF - VF1) + \text{Vout1\_s} \quad (9)$$

The last term +Vout1_s in the right hand side of the equation (9) is an offset correction value.

A gradient α12_s of the line segment S1-S2 is, according to the equation (9), represented by the equation (10) below.

$$\alpha 12\_s = (Vout2\_s - Vout1\_s)/(VF2 - VF1) \quad (10)$$

Therefore, an input voltage value VF can be calculated from the obtained measurement value Vout_s according to the equation (11) below which is a modified representation of the equation (9).

$$VF = \frac{(\text{Vout\_s} - \text{Vout1\_s})}{\alpha 12\_s} + VF1 \quad (11)$$

A chip temperature can be calculated from the voltage VF that is obtained by this reversed calculation, using the characteristic line representing the relationship between temperature and forward voltage VF of the temperature detecting diode shown in FIG. 2B. Thus, the chip temperature Tc=25° C. when the voltage VF=2.0619 V, the chip temperature Tc=155° C. when the voltage VF=1.5298 V, and any other voltage VF gives a corresponding chip temperature Tc.

The above explanation is appropriate for an ideal case in which circuit constants are exactly the designed values. In actual, however, some scatterings are present in output voltages of the voltage sources Vcc1 and Vcc2, the reference voltage for the A/D converter 101, and resistance values in the circuit components indicated in FIG. 3. Thus, the actual relation line is, as shown in FIG. 6, not the line segment S1-S2 but the line segment M1-M2 indicated by the chain line, which is altered from the line segment S1-S2.

When the constant voltage source 110 shown in FIG. 5 applies a voltage VF1 corresponding to a chip temperature of 155° C. and a voltage VF2 corresponding to 25° C., attention is paid to the line segment S1-S2 that connects a measurement value Vout1_s in the design from the A/D converter 101 for the input voltage VF1 and a measurement value Vout2_s in the design for the input voltage VF2, and to the line segment M1-M2 that connects a measurement value Vout1_m obtained in the actual measurement for the input voltage VF1 and a measurement value Vout2_m obtained in the actual measurement for the input voltage VF2.

A gradient and offset are different for the line segment S1-S2 and for the line segment M1-M2. Hence, if the line segment S1-S2 is used to obtain a forward voltage VF by reversed calculation from the actually measured value Vout_m, the obtained forward voltage VF includes an error caused by the difference between the line segment S11-S2 and the line segment M1-M2. Therefore, correction must be made to the gradient and offset so that the relation of the line segment M1-M2 is applied in the reversed calculation to obtain a forward voltage VF from an actually measured Vout_m.

A measured value Vout_m for any forward voltage VF across the temperature detecting diode DU2 is represented by the equation (12) below using the characteristic of the line segment M1-M2 actually obtained by the chip temperature detecting circuit 13.

$$\text{Vout\_m} = \frac{(\text{Vout2\_m} - \text{Vout1\_m})}{(VF2 - VF1)} \times (VF - VF1) + \text{Vout1\_m} \quad (12)$$

Using a gradient $\alpha 12\_m$ defined by the equation (13) below, a forward voltage VF of the temperature detecting diode DU2 is obtained from the measured value Vout_m according to the equation (14) below which is a representation obtained by modifying the equation (12). Thus, a forward voltage VF is obtained eliminating the effects of scattering in characteristics of circuit elements.

$$\alpha 12\_m = (\text{Vout2\_m} - \text{Vout1\_m})/(VF2 - VF1) \quad (13)$$

$$VF = \frac{(\text{Vout\_m} - \text{Vout1\_m})}{\alpha 12\_m} + VF1 \quad (14)$$

An accurate chip temperature can be obtained from the forward voltage VF represented by the equation (14) of the temperature detecting diode eliminating the effects of scattering in characteristics of circuit elements of the chip temperature detecting circuit. An accurate chip temperature is obtained based on such a forward voltage VF and using the characteristic line in FIG. 2B which represents the relationship between temperature and forward voltage of the temperature detecting diode.

In the above described procedure, the equations (9) and (11) that are based on design have been replaced by the equations (12) and (14) that are based on actually measured values. This is equivalent to replacing the line segment S1-S2 by the line segment M1-M2, and it means that gradient correction and offset correction have been implemented on the line segment S1-S2.

In the correction procedure, a voltage value VF1 corresponding to a chip temperature of 155° C. and a voltage value VF2 corresponding to a chip temperature of 25° C. are applied by the constant voltage source 110. In the calibration processing section 107 shown in FIG. 4, the measurement values Vout1_m and Vout2_m delivered from the A/D converter 101 are read-in and the gradient $\alpha 12\_m$ of the line segment M1-M2 is calculated using the equation (13). The gradient $\alpha 12\_m$ and the offset correction value Vout1_m are stored in the non-volatile memory 106.

The chip temperature calculating section 108 receives a measured value Vout_m delivered from the A/D converter 101 in the state with the temperature detecting diode DU2 connected, and calculates a forward voltage VF across the temperature detecting diode DU2 according to the equation (14) using the gradient $\alpha 12\_m$ of the line segment M1-M2 and the offset correction value Vout1_m that are stored in the non-volatile memory 106 as well as the measured value Vout_m. The chip temperature calculating section 108 then calculates a chip temperature Tc based on the calculated forward voltage VF referring to the characteristic line shown in FIG. 2B.

Figure 7:
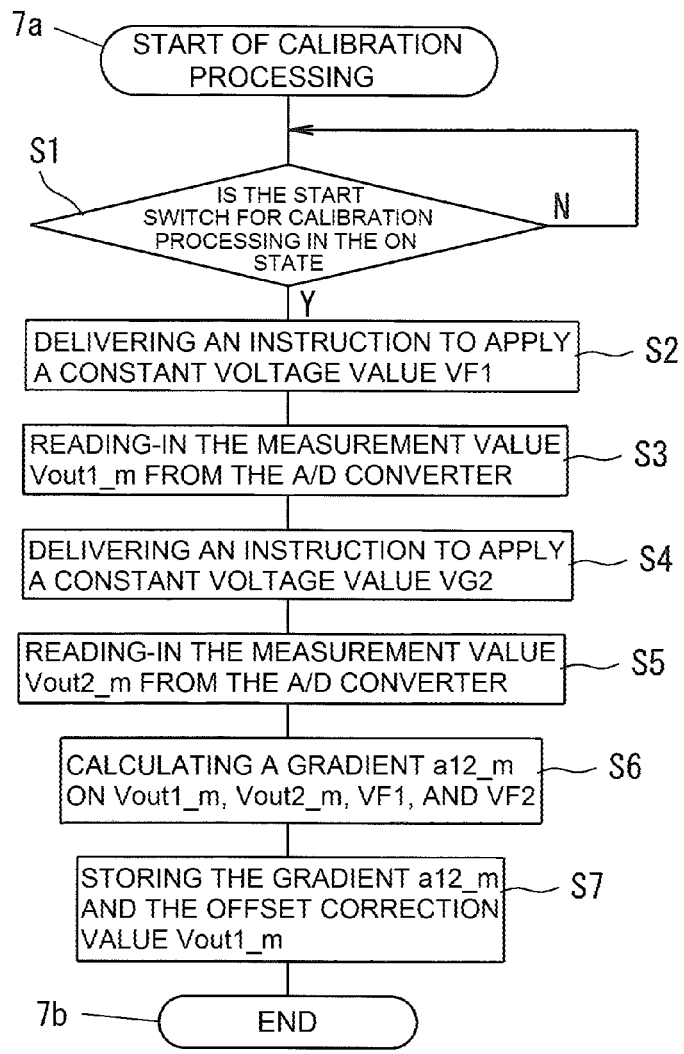
FIG. 7 is a flow-chart showing an example of the sequence of the calibration processing to be conducted in the central processing unit.

The central processing unit 104 of the microcomputer 102 executes operational processing shown in FIG. 7.

This operational processing as shown in FIG. 7 starts at 7a and first executes the step S1 that checks whether a calibration start switch 109 is in an ON state or not, the calibration start switch being of a momentary type, for example, and connected to the central processing unit 104. If the calibration start switch 109 is in an OFF state, the operational processing halts until the switch 109 turns ON. When the calibration start switch 109 becomes ON state, the operational processing proceeds to the step S2.

In the step S2, an instruction is given to the constant voltage source 110 to apply a voltage value VF1 that corresponds to a chip temperature of 155° C. After that, the operational processing proceeds to the step S3. In the step S3, a measurement value Vout1_m delivered from the A/D converter 101 is read-in after a predetermined time has passed until a measurement value corresponding to the applied voltage VF1 is delivered from the A/D converter 101.

When the operational processing proceeds to the step S4, in which an instruction is given to the constant voltage source 110 to apply a voltage value VF2 that corresponds to a chip temperature of 25° C. After that, the operational processing proceeds to the step S5. In the step S5, a measurement value Vout2_m delivered from the A/D converter 101 is read-in after a predetermined time has passed until a measurement value corresponding to the applied voltage VF2 is delivered from the A/D converter 101. After that, the operational processing proceeds to the step S6.

In the step S6, the gradient $\alpha 12\_m$ of the line segment M1-M2 is calculated according to the equation (13) using the read-in measurement values Vout1_m and Vout2_m as well as the known voltage values VF1 and VF2. After that, the operational processing proceeds to the step S7.

In the step S7, the calculated gradient $\alpha 12\_m$ of the line segment M1-M2 and the offset correction value Vout1_m are stored in the non-volatile memory 106. Thus, the calibration processing has been completed at 7b.

Figure 8:
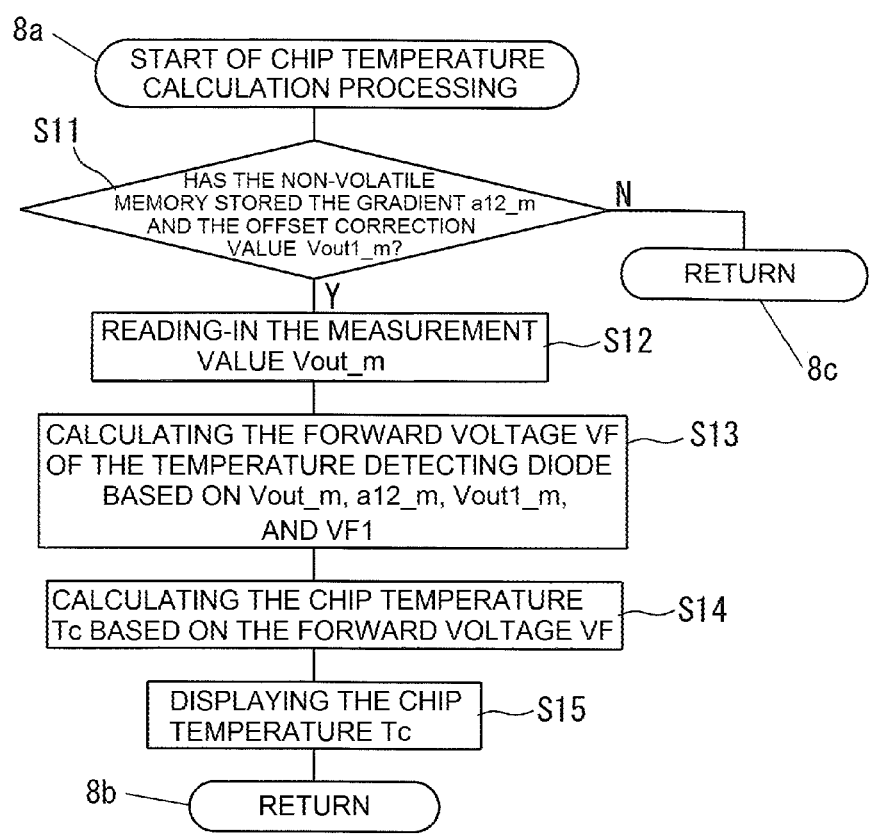
FIG. 8 is a flow-chart showing an example of the sequence of the chip temperature calculation processing to be conducted in the central processing unit.

Chip temperature calculation processing proceeds as shown in FIG. 8 as a timer-interrupted process at every predetermined interval. Chip temperature calculation processing begins at 8a, and then step S11 checks whether or not the non-volatile memory 106 stores the gradient $\alpha 12\_m$ of the line segment M1-M2 and the offset correction value Vout1_m. If the non-volatile memory 106 does not store the gradient $\alpha 12\_m$ and the measurement value Vout1_m, which is the offset correction value, then the timer-interrupted process ends at 8c and processes of the main program are resumed.

If the check of the step S11 results that the non-volatile memory 106 stores the gradient $\alpha 12\_m$ and the measurement value Vout1_m, the next step S12 is executed in which a measured value Vout_m delivered from the A/D converter 101 is read-in.

The chip temperature calculation processing proceeds to the step S13 in which a forward voltage VF across the temperature detecting diode DU2 is calculated according to the equation (14) using the gradient α12_m of the line segment M1-M2 and the offset correction value Vout1_m that are stored in the non-volatile memory 106 and the measured value Vout_m that has been read-in in the step S12.

In the next step S14, a chip temperature Tc is calculated based on the forward voltage VF calculated in the step S13 and referring to a table stored in a ROM or other types of recording medium for designating a relationship between chip temperature and forward voltage as shown in FIG. 2B.

The next step S15, the indication information of the chip temperature Tc calculated in the step S14 is delivered to a display device of liquid crystal, for example, connected to the central processing unit 104. After the step S15, the timer-interrupted process ends at 8b and predetermined procedure in the main program is resumed.

The calibration processing of FIG. 7 is executed in the calibration processing section 107 in FIG. 4 and the chip temperature calculation processing of FIG. 8 is executed in the chip temperature calculating section 108 in FIG. 4.

Now, operation of the first embodiment according to the present invention will be described in the following.

To execute calibration processing of the chip temperature detecting circuit 13 (or 14) in an adjusting operation step for the intelligent power module, a constant voltage source 110 that can deliver voltage values VF1 and VF2 according to a voltage application instruction is first connected as shown in FIG. 5 in place of a temperature detecting diode DU2 (or DD2).

In this state, the start switch 109 for the calibration processing in the microcomputer 102 is turned ON to start the calibration processing as shown in FIG. 7 in the central processing unit 104.

The turning ON of the start switch 109 for calibration processing proceeds the calibration processing from the step S1 to the step S2, in which an instruction is given to the constant voltage source 110 to apply a voltage value VF1 corresponding to a temperature of 155° C.

According to the instruction, the voltage value VF1 is applied by the constant voltage source 110 between the terminals provided for connecting the temperature detecting diode DU2 (or DD2). This voltage value VF1 is level-converted in the level converter 77 to a level-converted voltage Vlev, which in turn is given to a comparator IC5 of a pulse width modulation circuit 76. Since the comparator IC5 also receives a triangular voltage Vtri that is delivered from a triangular wave generating circuit 78, the comparator IC5 delivers a pulse width modulation signal with a duty factor corresponding to the level-converted voltage Vlev. This pulse width modulation signal is transmitted via resistor 80 through a field effect transistor 81, a resistor 82 and a photo-coupler 90, comprising light-emitting diode 85, photodiode 87 and transistor 88, where resistors 84 and 89 are connected across light-emitting diode 85 and photodiode 87 respectively. to a PWM-analogue conversion circuit 91.

In the PWM-analogue conversion circuit 91, a binarization circuit 92 generates a binary signal according to the pulse width modulation signal given through the photo-coupler 90, a buffer circuit 93 comprising operational amplifier IC6 conducts impedance conversion, and then a low pass filter circuit 94 smoothes to convert to a DC level signal.

The DC level signal is delivered to an A/D converter 101, which conducts digital conversion and outputs as a measurement value.

A measurement value Vout1_m corresponding to the voltage value VF1 is read-in by a central processing unit 104 in the step S3 shown in FIG. 7. Then, an instruction is delivered to the constant voltage source 110 to apply a voltage value VF2 corresponding to 25° C.

According to the instruction, the constant voltage source 110 applies a voltage value VF2 between the terminals that are provided for connecting the temperature detecting diode DU2 (or DD2). The applied voltage VF2 is converted to a pulse width modulation signal in the same way as described above and transmitted to the PWM-analogue conversion circuit 91, in which the PWM signal is converted to a DC level signal, which in turn is delivered from the A/D converter 101 as a measurement voltage Vout2_m, which is read-in to the central processing unit 104 in the step S5 shown in FIG. 7.

The gradient α12_m of the line segment M1-M2 shown by the chain line in FIG. 6 is calculated according to the equation (13) using the read-in measurement values Vout1_m and Vout2_m and the known voltage values VF1 and VF2 in the step S6. This gradient is the gradient of applied reference voltages and the output voltages of the A/D converter corresponding to the reference voltages.

Thus, the non-volatile memory 106 stores, in the step 7, the calculated gradient α12_m of the line segment M1-M2 and the offset correction value Vout1_m, which is one of the measurement values Vout1_m and Vout2_m. Thus, a calibration processing is completed.

After the gradient α12_m of the line segment M1-M2 and the offset correction value Vout1_m have been stored in the non-volatile memory 106 in the calibration processing, the constant voltage source 110 is removed and the temperature detecting diode DU2 (or DD2) is connected. Then, the microcomputer 102 is rebooted.

Then, the central processing unit 104 executes chip temperature calculation processing as shown in FIG. 8. Since the non-volatile memory 106 has stored, in the previous processing, the gradient α12_m of the line segment M1-M2 and the offset correction value Vout1_m, the chip temperature calculating processing proceeds from the step 11 to the step 12, in which a measured value Vout_m is read-in corresponding to the forward voltage VF across the temperature detecting diode DU2 (or DD2) delivered from the A/D converter 101.

Then, a forward voltage VF across the temperature detecting diode DU2 (or DD2) is calculated in the step S13 according to the equation (14) using the read-in measured value Vout_m, the gradient α12_m of the line segment M1-M2 and the offset correction value Vout1_m that are stored in the non-volatile memory 106, and the known voltage value VF1.

Based on the calculated forward voltage VF, a chip temperate Tc is calculated in the step S14 referring to the table representing the forward voltage-chip temperature relationship as shown in FIG. 2B. The calculated chip temperature Tc is shown on a display device in the step S15 to complete the timer-interrupted process.

As described above, on the adjustment operation stage for the first embodiment according to the invention, calibration processing is conducted having the constant voltage source 110 connected in place of the temperature detecting diode DU2 (or DD2), and the gradient α12_m of the line segment M1-M2 is calculated. The calculated gradient α12_m as well as the offset correction value Vout1_m are stored in the non-volatile memory 106.

After that, the temperature detecting diode DU2 (or DD2) is connected in the regular way, and in this state, chip temperature calculation processing is executed. Through the procedure, an accurate chip temperature Tc can be obtained eliminating the effects of scattering in characteristics of the circuit elements in the chip temperature detecting circuit 13 (or 14) by performing gradient correction and offset correction with respect to the designed line segment S1-S2.

The gradient α12_m of the line segment M1-M2 is calculated and stored together with the offset correction value Vout1_m in the non-volatile memory 106. Therefore, calculation processing of the chip temperature Tc can be carried out readily and operation load on the central processing unit 104 is lightened.

In the description about the first embodiment, the operational processing uses the measurement values Vout1_m, Vout2_m, and Vout_m as original values as delivered from the A/D converter 101. In some cases, however, the process of taking-in the measurement values from the A/D converter 101 may be influenced by noises. The influence of noises can be reduced by sampling, at multiple times, the measurement values delivered from the A/D converter 101 and the data of the multiple times of sampling are processed to obtain arithmetic mean values that are used for the measurement values of Vout1_m, Vout2_m, and Vout_m in the following processing.

Figure 9:
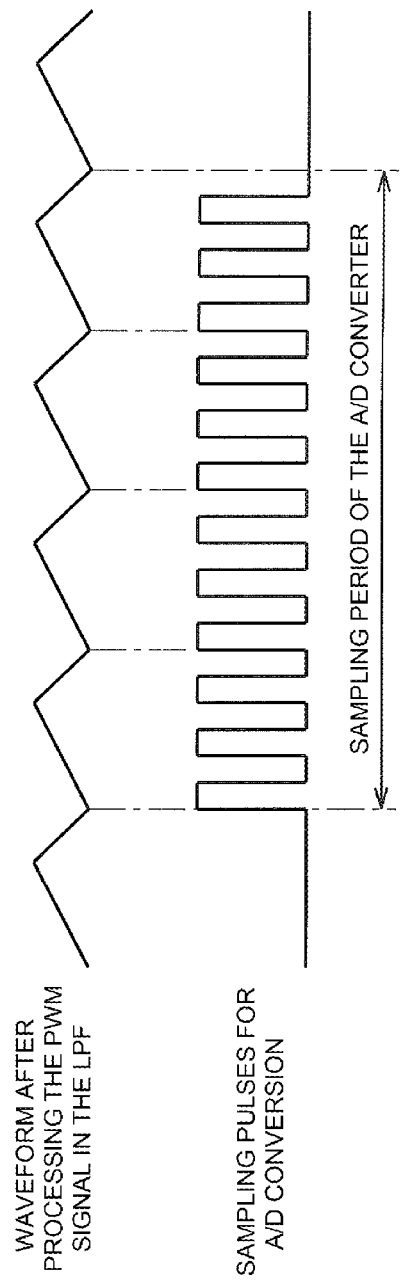
FIG. 9 is a timing chart showing relationship between the output from the low-pass filter to be delivered to the A/D converter and the sampling period of the A/D converter.

The input signal to the A/D converter 101 is a DC level signal that is obtained by smoothing the pulse width modulated signal (PWM signal) in the low pass filter circuit 94. But the signal delivered from the low pass filter 94 as microscopically observed has fluctuation with an amplitude of several tens of millivolts as depicted by the upper waveform in FIG. 9. Accordingly, sampling is conducted in the A/D converter 101 as depicted by the lower waveform in FIG. 9, with sampling period of arbitrary n times (n is an integer) of the period of the change, which is the frequency of the triangular wave generator 78 in the pulse width modulation circuit 76. By using the arithmetic mean values of the sampled data for the measurement values of Vout1_m, Vout2_m, and Vout_m, the influence of fluctuation in the input signal to the A/D converter 101 is reduced.

Next, a second embodiment according to the present invention will be described in the following with reference to FIG. 10.

In the second embodiment, the A/D converter is disposed not at the side of the microcomputer 102, but next to the temperature detecting diode and the forward voltage of the diode is directly converted to a digital data.

Figure 10:
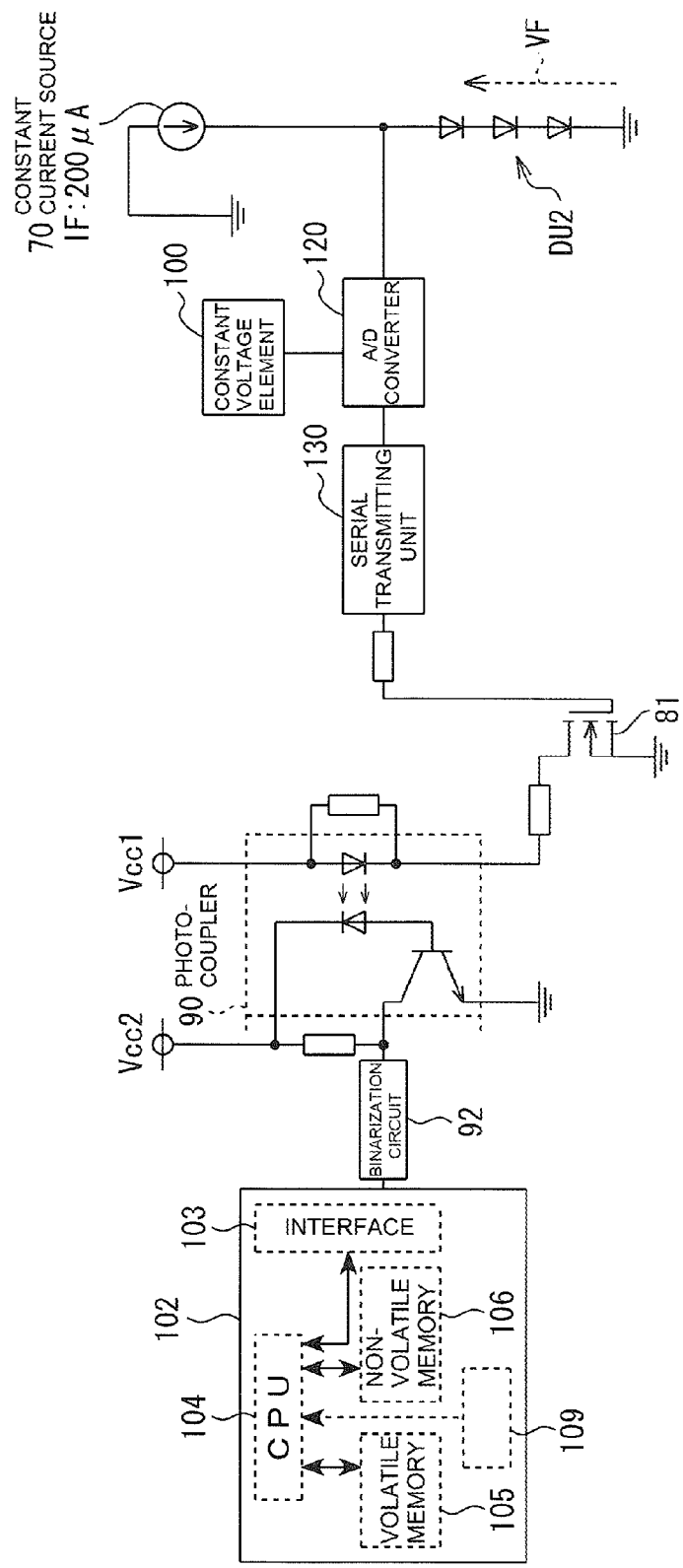
FIG. 10 is a circuit diagram of a chip temperature detecting circuit in the second embodiment according to the present invention.
Figure 11:
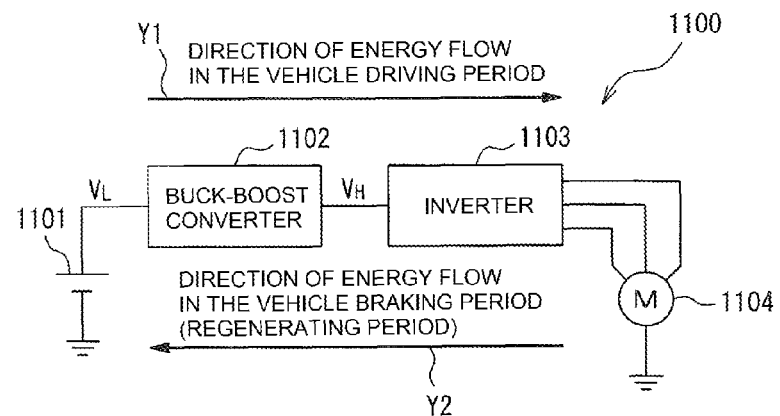
FIG. 11 is a block diagram showing construction of a vehicle driving system.

In the construction of the second embodiment shown in FIG. 10, the forward voltage VF of the temperature detecting diode DU2 (or DD2) undergoes direct digital conversion in the A/D converter 120 to output a measurement value, which is transmitted through a serial transmission unit 130 installed in a low function microcomputer, and delivered to the gate of a field effect transistor 81.

As a result, the PWM-analogue conversion circuit 91 shown in FIG. 3 can be removed leaving solely a binarization circuit 92. The binary signal delivered by the binarization circuit 92 directly enters an interface circuit 103 of microcomputer 102. The central processing unit 104 of the microcomputer 102 executes calibration processing and chip temperature calculation processing in the same manner as shown in FIG. 7 and FIG. 8 for the processing in the first embodiment. Thus, the calibration processing is conducted with a constant voltage source 110 connected, in place of the temperature detecting diode DU2 (or DD2), between the terminals to connect the temperature detecting diode afterward.

In the second embodiment, the forward voltage VF of the temperature detecting diode DU2 (or DD2) is directly converted to a measurement value in the A/D converter 120. This measurement value is simply transmitted through a serial transmission unit 130, a field effect transistor 81, and a photo-coupler 90, and converted to a binary signal in a binarization circuit 92 to deliver to the microcomputer 102. Thus, the construction of the chip temperature detecting circuit 13 (or 14) is significantly simplified, although a serial transmission unit 130 that is mounted on a low-function microcomputer needs to be installed in the arm side.

Although explanation has been omitted, in calibration processing of the chip temperature detecting circuits 13 and 14 of the first and second embodiments, it is preferable that the calibration processing is conducted with a constant voltage source 110 connected between the terminals to connect the temperature detecting diode DU2 and DD2 in the chip temperature detecting circuits 13 and 14 before the control circuit 3 is connected to the power switching element SWU of the upper arm 1 and the power switching element SWD of the lower arm 2. After the calibration processing, the control circuit 3 is connected to the power switching elements SWU and SWD to detect chip temperature.

In the description of calibration processing in the first and second embodiments, the gradient α12_m of the line segment M1-M2 and the offset correction value Vout1_m are stored in a non-volatile memory 106. The non-volatile memory 106 in the invention can be any non-volatile recording medium including flash memory, EPROM, and ROM. In addition, RAM and other recording medium that works with always supplied power can be used for the non-volatile memory 106. In short, any recording medium can be applied that can record and read out the gradient α12_m of the line segment M1-M2 and the offset correction value Vout1_m that are calculated in the calibration processing.

The offset correction value in the first and second embodiment described above is the measurement value Vout1_m. Instead, the offset correction value can be the measurement value Vout2_m.

It will be appreciated by those skilled in the art that the invention may be practiced otherwise than as in the above embodiments, and that various changes and substitutions may be made, without departing from the scope of the invention.

What is claimed is:

1. A temperature measuring device of a power semiconductor apparatus, the power semiconductor apparatus including a silicon chip with a power switching element and a temperature detecting diode thereon, the temperature measuring device detecting a chip temperature of the power switching element, the temperature measuring device comprising:
   a constant current source that supplies constant current to the temperature detecting diode,
   an A/D converter that outputs digital values representing forward voltage across the temperature detecting diode,
   an operational processing unit that calculates the chip temperature based on the digital values, the operational processing unit including a calibration processing section and a chip temperature calculating section, and
   a memory,
   a reference voltage source that successively generates a plurality of known reference voltages,
   a calibration processing section that selectively connects the reference voltage source to input terminals of the chip temperature calculating section and simultaneously disconnects the temperature detecting diode from the input terminals of the chip temperature calculating section, where the calibrating section calculates a gradient of a line segment connecting the digital values outputted from the A/D converter when the plurality of reference voltages are applied, wherein the gradient and an offset correction value of the digital values are stored in the memory, and wherein the chip temperature calculating section calculates the chip temperature according to a corrected value based on a measurement value of the digital values and also based on the gradient and the offset correction value.

2. The temperature measuring device according to claim 1, wherein the calibration processing section measures plural times to obtain digital calibration values corresponding to each value of the reference voltage and calculates a mean value thereof.

3. The temperature measuring device according to claim 1, further comprising:

a pulse width modulation circuit that generates a pulse width modulation signal dependent upon the forward voltage across the temperature detecting diode, an electrically isolated transmission circuit that transmits the pulse width modulation signal, and a low pass filter that smooths a signal received from the isolated transmission circuit and supplies the smoothed signal to the A/D converter.

4. The temperature measuring device according to claim 3, wherein the pulse width modulation circuit further comprises a triangular wave generating circuit, and the calibration processing section conducts sampling for the digital values on application of the reference voltage in a period of an integer times of an oscillation period of the triangular wave generating circuit and calculates a mean value of the sampled measurement values.

5. The temperature measuring device according to claim 1, wherein the memory is a non-volatile memory in the operational processing unit.

6. The temperature measuring device according to claim 1, wherein the calibration processing section sets the different known reference voltages within a range of forward voltages across the temperature detecting diode at the maximum and the minimum temperatures in chip temperature measurement.

7. The temperature measuring device according to claim 1, wherein the calibration processing section sets the minimum and the maximum values of the different known reference voltages to be equal to the forward voltage values across the temperature detecting diode at the highest and the lowest temperatures of a measurement range of the chip temperature.

* * * * *